(12) United States Patent
Kuznetsov

(10) Patent No.: US 10,298,212 B2
(45) Date of Patent: *May 21, 2019

(54) METHOD AND APPARATUS FOR CONTROL OF PULSED POWER IN HYBRID ENERGY STORAGE MODULE

(71) Applicant: Raytheon Company, Waltham, MA (US)

(72) Inventor: Stephen Kuznetsov, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/828,206

(22) Filed: Nov. 30, 2017

(65) Prior Publication Data

US 2018/0159515 A1 Jun. 7, 2018

Related U.S. Application Data

(63) Continuation of application No. 14/591,695, filed on Jan. 7, 2015, now Pat. No. 9,837,996.

(51) Int. Cl.
*H02J 9/06* (2006.01)
*H02J 15/00* (2006.01)
(Continued)

(52) U.S. Cl.
CPC ............... *H03K 3/45* (2013.01); *H02J 1/16* (2013.01); *H02J 5/00* (2013.01); *H02J 9/066* (2013.01); *H02J 15/00* (2013.01); *H02M 7/98* (2013.01)

(58) Field of Classification Search
CPC ............ H02J 9/066; H02J 15/00; H02M 7/98; H03K 3/45
(Continued)

(56) References Cited

U.S. PATENT DOCUMENTS 1,646,823 A 10/1927 Karapetoff
2,149,082 A 2/1939 Buell et al.
(Continued)

FOREIGN PATENT DOCUMENTS

EP 0849170 6/1998
WO WO 02061910 A2 8/2002

OTHER PUBLICATIONS

3M Electronics, Product information, "3M Novec 649 Engineered Fluid", <URL: http://solutions.3mmagyar.hu/3MContentRetrievalAPI/BlobServlet?lmd=1351678101000&locale=hu_HU&assetType=Mmm_Image&assetId=1319241050803&blobAttribute=ImageFile>, Sep. 9, 2009, 4 pages.
(Continued)

*Primary Examiner* — William Hernandez

(57) ABSTRACT

A hybrid energy storage system is configured to control pulsed power. A first dynamo-electric machine is coupled to an inertial energy storage device and has multiple input stator windings configured to accept input power from a source. A polyphase output stator winding is configured to deliver electric power having a first response time to a DC bus. A secondary energy storage system is coupled to the DC bus and is configured to convert its stored energy to electric power in a bidirectional manner. A second dynamo-electric machine has an input stator winding and at least one polyphase output stator winding coupled to a converter, the converter coupled to a DC output. A polyphase boost exciter is configured to derive energy from the DC bus and excite the second machine input stator winding, wherein the second machine is configured to be excited at a faster rate than the first response time of the first machine.

20 Claims, 19 Drawing Sheets

(51) Int. Cl.
  *H02M 7/98* (2006.01)
  *H03K 3/45* (2006.01)
  *H02J 1/16* (2006.01)
  *H02J 5/00* (2016.01)

(58) Field of Classification Search
  USPC .............................. 307/67, 68, 106, 107, 108
  See application file for complete search history.

(56) References Cited

U.S. PATENT DOCUMENTS

| | | | |
|---|---|---|---|
| 2,740,510 | A | 4/1956 | Berthold |
| 3,024,298 | A | 7/1958 | Goltsos et al. |
| 3,004,381 | A | 10/1961 | Schweitzer |
| 3,183,431 | A | 5/1965 | Ford |
| 3,187,250 | A | 6/1965 | Born et al. |
| 3,315,148 | A | 4/1967 | Grillo |
| 3,452,229 | A | 6/1969 | Pimlott et al. |
| 3,571,693 | A | 3/1971 | Riaz |
| 3,667,012 | A | 5/1972 | Kilgore |
| 4,001,666 | A | 1/1977 | Grenfell |
| 4,011,535 | A | 3/1977 | Kosky et al. |
| 4,048,603 | A | 9/1977 | Staub et al. |
| 4,393,964 | A | 7/1983 | Kemper |
| 4,439,720 | A | 3/1984 | Georges |
| 4,444,444 | A | 4/1984 | Benedetti et al. |
| 4,612,494 | A | 9/1986 | Kawamura |
| 4,926,107 | A | 5/1990 | Pinson |
| 4,971,522 | A | 11/1990 | Butlin |
| 5,097,194 | A | 3/1992 | Walton et al. |
| 5,646,458 | A | 7/1997 | Bowyer et al. |
| 5,921,505 | A | 7/1999 | Spector |
| 6,023,152 | A | 2/2000 | Briest et al. |
| 6,078,119 | A | 6/2000 | Satoh et al. |
| 6,161,495 | A | 12/2000 | Ambs |
| 6,239,513 | B1 | 5/2001 | Dean et al. |
| 6,573,626 | B1 | 6/2003 | Gosebruch et al. |
| 6,710,579 | B2 | 3/2004 | Ebel et al. |
| 7,663,328 | B2 | 2/2010 | Gonder |
| 7,710,081 | B2 | 5/2010 | Saban et al. |
| 9,373,963 | B2 * | 6/2016 | Kuznetsov ................ H02J 4/00 |
| 2005/0012395 | A1 | 1/2005 | Eckroad et al. |
| 2008/0103632 | A1 | 5/2008 | Saban et al. |
| 2009/0134705 | A1 | 5/2009 | Kalev |
| 2011/0084568 | A1 | 4/2011 | Lateb et al. |
| 2012/0187922 | A1 | 7/2012 | Dubois et al. |
| 2012/0286523 | A1 | 11/2012 | Hull et al. |
| 2013/0020893 | A1 | 1/2013 | Bradley et al. |
| 2013/0127391 | A1 | 5/2013 | Lewis |
| 2013/0257186 | A1 | 10/2013 | Kozar et al. |
| 2013/0260999 | A1 | 10/2013 | Hull et al. |
| 2013/0261001 | A1 | 10/2013 | Hull et al. |
| 2013/0285491 | A1 | 10/2013 | Kuznetsov |
| 2014/0346868 | A1 | 11/2014 | Kuznetsov |
| 2016/0336928 | A1 * | 11/2016 | Kuznetsov ................ H02J 3/30 |

OTHER PUBLICATIONS

Walls, W.A., "Rotating machines for pulsed power", IEEE Xplore Abstract, Conference Record of the 25th International Symposium and 2002 High-voltage Workshop, Jun. 30-Jul. 3, 2002, 8 pages, IEEE, New York, N.Y.

Notification of Transmittal of the International Search Report and the Written Opinion of the International Searching Authority in PCT/US2016/032161 dated Mar. 9, 2017; 11 pages.

Kuznetsov, S.; U.S. Patent Application entitled "Inertial Energy Storage System and Hydro-Fluoro-Ether Power Transformer Scheme for Radar Power Systems and Large PFN Charging," U.S. Appl. No. 14/245,754, filed Apr. 4, 2014, 54 pgs.

Kuznetsov, S.; U.S. Patent Application entitled "Electro-Mechanical Kinetic Energy Storage Device and Method of Operation," U.S. Appl. No. 13/458,586, filed Apr. 27, 2012, 38 pgs.

Kuznetsov, S.; U.S. Patent Application entitled "System and Method for Parallel Configuration of Hybrid Energy Storage Module," U.S. Appl. No. 14/711,632, filed May 13, 2015, 55 pgs.

International Search Report and Written Opinion issued for International Application No. PCT/US2016/012513, dated May 30, 2016, 11 pgs.

L.A. Kilgore et al., "Energy Storage at Site Permits Use of Large Excavators on Small Power Systems", Westinghouse Engineer, Nov. 1970, vol. 30 No. 6, pp. 162-167.

Limpaecher et al., "Resonant Link PFN Charger and Modular Power Supply," Science Application International Corporation Electrical Power Technology Division, IEEE, 2007; pp. 1495-1499.

Narbut et al.; "Vaporization Cooling for Power Transformers," Transaction of the AIEE; Power Apparatus & Systems, Part III; Dec. 1959; 7 pages.

Moore et al.; "Design and Performance Characteristics of Gas/Vapor Transformers," Trans. IEEE: Power Apparatus & Systems; vol. PAS-101; Jul. 1982; 4 pages.

Mike Strasik, "Flywheel Electricity Systems with Superconducting Bearings for Utility Applications," Boeing Phantom Works, Jul. 28, 2004, 32 pages.

International Search Report and Written Opinion issued for International Application No. PCT/US2015/017264, dated Sep. 2, 2015, 5 pgs.

* cited by examiner

FIG. 13

METHOD AND APPARATUS FOR CONTROL OF PULSED POWER IN HYBRID ENERGY STORAGE MODULE

CROSS-REFERENCE TO RELATED APPLICATION AND PRIORITY CLAIM

This application is a continuation of U.S. patent application Ser. No. 14/591,695 filed on Jan. 7, 2015, which is hereby incorporated by reference in its entirety.

TECHNICAL FIELD

This disclosure is generally related to pulsed power systems at the megawatt level and gigawatt level, such as those utilized in radar power systems, and more particularly to an inertial energy storage system for radar power systems and large pulse forming network (PFN) charging or operating pulsating loads.

BACKGROUND OF THE DISCLOSURE

Large scale energy storage involves several different mechanisms of energy storage which differ in application by how fast and how frequently each subsystem can absorb or deliver energy. Conventional systems are inadequate for transferring large blocks of energy from slow response sources to fast response loads or fast intermediate loads, and recovering energy from pulsed power loads to either intermediate response sources or to an AC source.

Energy storage and pulsed power at the megawatt and gigawatt level require new topologies for the magnetics of the transformer and the electrical machinery, as well as enhanced cooling to reduce component critical temperatures, extend lifetime and allow faster repetition rates for an effector. High-voltage DC (HVDC) outputs are useful to power pulsed power loads, and low-voltage (LVDC) outputs are useful to power radar and lower power pulse forming network (PFN) loads. The combination of an electro-chemical energy source with an inertial energy source allows for a fast response system which can accommodate both high energy loads and high average power loads and provide multiple voltage levels of output.

SUMMARY OF THE DISCLOSURE

To address one or more of the above-deficiencies of the prior art, several embodiments described in this disclosure provide a hybrid inertial energy storage system, such as for radar power systems and large pulse forming network (PFN) charging.

According to one example embodiment of the disclosure, a system comprises an inertial energy storage device, and a first dynamo-electric machine directly coupled to the inertial energy storage device. The first dynamo-electric machine has multiple input stator windings configured to accept AC input power from an AC source, a rotor winding configured to be excited by an AC exciter, and having at least one polyphase output stator winding configured to deliver electric power at a first rate to a DC bus. A secondary energy storage system is coupled to the DC bus and is configured to exchange electrical energy in a bidirectional manner. A second dynamo-electric machine is coupled to the inertial energy storage device and the first machine by a shaft, the second machine having an input stator winding and at least one polyphase output stator winding coupled to a stator output, the stator output coupled to a DC output. A polyphase boost exciter is configured to derive energy from the DC bus and excite the second machine input stator winding, wherein the second machine is configured to be excited at a second rate that is faster than the first rate.

In some embodiments, at least one polyphase output stator winding of the first machine is configured to deliver electric power to the DC bus at a plurality of power, duty-cycle and voltage levels. The system is configured to bi-directionally transfer energy between the DC output, the secondary energy storage system, the inertial energy storage system, and the AC source. The system may further comprise a pulse forming network (PFN) coupled between the DC bus and the polyphase boost exciter. The second machine has a plurality of electrically isolated stator outputs formed by polyphase output stator windings configured to create discrete phase shifts between the stator windings, such as 0 degrees, 15 degrees, 30 degrees and 45 degrees at the DC output. A converter is coupled between at least one of the second machine stator outputs and the DC output and configured to increase frequency and voltage, and may comprise a bi-directional rectifier and inverter. A bi-directional rectifier and inverter is coupled between the first machine at least one polyphase output stator winding and the DC bus. A PFN driven load and a stochastic load are coupled to the DC bus. An array of active front end (AFE) and load resonant converters (LRCs) are coupled to the first machine input stator windings. The AFE and LRCs are configured to provide variable-voltage variable-frequency power from a DC power source to the first machine input stator windings. An array of active front end (AFE) and load resonant converters (LRCs) are coupled between the second machine stator outputs and the DC output. A gearbox is coupled to the shaft, the gearbox configured to increase the speed of the shaft at the second machine. The first machine and the second machine each comprise a wound-rotor field synchronous modulator. The secondary energy storage system comprises an electro-chemical battery.

In another example embodiment, a system comprises a flywheel, and a first dynamo-electric machine directly coupled to the flywheel. The first dynamo-electric machine has multiple input stator windings configured to accept AC input power from an AC source, a rotor winding configured to be excited by an AC exciter, and at least one polyphase output stator winding configured to deliver electric power at a first rate to a DC bus at different power, frequency and voltage levels. An array of active front end (AFE) and load resonant converters (LRCs) are coupled to the first machine input stator windings and are configured to provide variable-voltage variable-frequency power from a DC power source to the first machine input stator windings. An electro-chemical battery is coupled to the DC bus and is configured to exchange electrical energy in a bidirectional manner. A second dynamo-electric machine is coupled to the flywheel and the first machine by a shaft, the second machine having an input stator winding and a plurality of polyphase output stator windings each coupled to a DC output. A polyphase boost exciter is configured to derive energy from the DC bus and excite the second machine input stator winding, wherein the second machine is configured to be excited at a second rate that is faster rate than the first rate. The system is configured to bi-directionally transfer energy between the DC output, the electro-chemical battery, the flywheel, and the AC source.

In some embodiments, the plurality of polyphase stator windings of the second machine are configured to create discrete phase shifts forming a multi-phase configuration which is rectified to obtain the DC output. A pulse forming network (PFN) is coupled between the DC bus and the polyphase boost exciter.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 13 illustrates a dual synchronous modulator system with balanced wound-rotor output electrical machines with two principal pulsed power outputs of different time constants and 5 energy storage units;

DETAILED DESCRIPTION

It should be understood at the outset that, although example embodiments are illustrated below, the present invention may be implemented using any number of techniques, whether currently known or not. The present invention should in no way be limited to the example implementations, drawings, and techniques illustrated below. Additionally, the drawings are not necessarily drawn to scale.

This disclosure solves a basic problem of transferring large blocks of energy from slow response sources to fast response loads or fast intermediate loads, and recovering energy from pulsed power loads to either intermediate response sources or to a DC or AC source. Specific embodiments are shown which utilize multiple level DC-to-AC and AC-to-AC input converters on both an active front end and on an output of a resonant converter. The multi-port electrical machinery is fully integrated with an inertial storage unit and an electro-chemical energy storage set with special application to pulse power fast-rise time loads.

Figure 1:
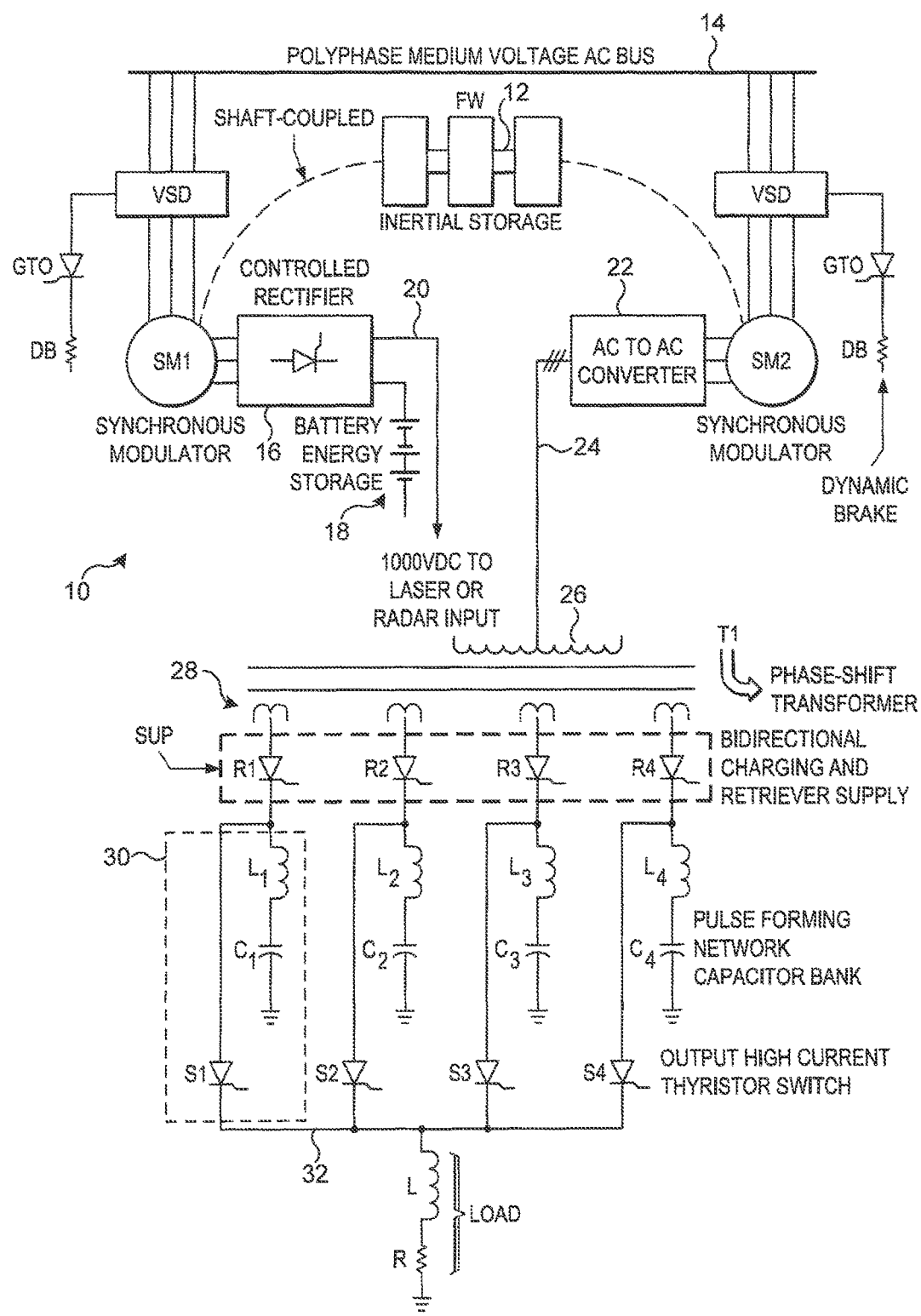
FIG. 1 illustrates a hybrid energy storage system comprising two identical electrical machines in parallel, coupled on the same shaft by a common inertial energy storage unit comprising a central flywheel.

FIG. 1 shows a hybrid energy storage system at 10 comprising two identical electrical machines (EMs) in parallel termed synchronous modulators SM1 and SM2, coupled on the same shaft 12 by a common inertial energy storage unit comprising a central flywheel FW providing energy storage at a maximum speed of E1. Machines SM1 and SM2 feed different types of loads, machine SM1 comprising a low voltage unit at a slow rep-rate and machine SM2 comprising a high voltage unit at a faster rep-rate. Both machines SM1 and SM2 are connected to a common AC bus 14 and are controlled in speed by a respective variable speed drive (VSD), the speed range generally restricted to the range of 70.7% to 100% of speed or an energy level of 50% to 100%. Machine SM1 feeds a polyphase controlled bidirectional rectifier 16 from a secondary winding located on a machine stator of machine SM1. The stator provides low voltage direct-current power, e.g. 1000 VDC, to power an electro-chemical storage bank 18, and a parallel low voltage output 20, such as to operate a laser or radar power supply at an approximately 1000 VDC input level. Transformer T1 is a phase shift transformer producing e.g. a 24 pulse rectified output using a controlled rectifier with devices R1-R4.

Figure 2A:
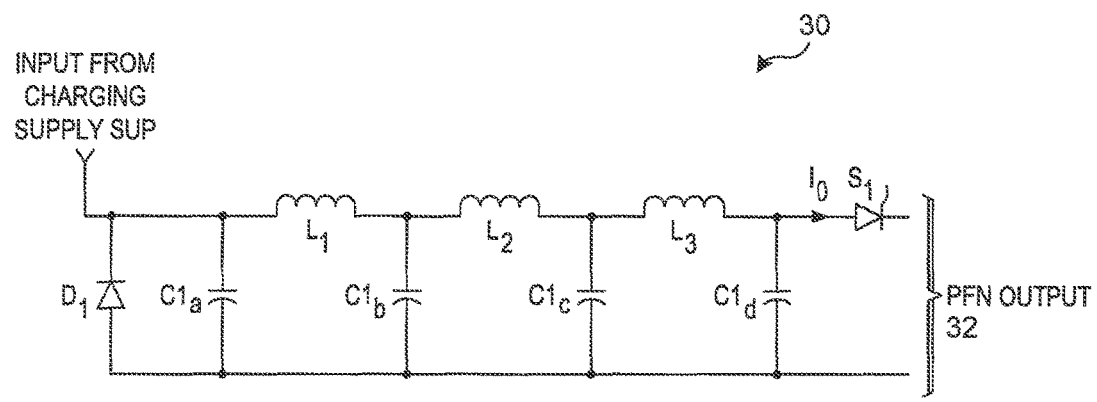
FIG. 2A illustrates a PFN comprising a 3-stage or greater network of capacitors and inductors.

Machine SM2 feeds an AC-to-AC resonant link converter 22 which produces high frequency polyphase power at its output terminals 24, coupling this power to a primary winding 26 of a phase shift winding power transformer T1 with four phase shift windings 28 at 0, 15°, 30° and 45°. Power from transformer T1 is rectified in a bidirectional charging supply SUP which charges capacitors C1 to C4 of each PFN 30. The capacitors C1 to C4 of each PFN 30 are discharged by a multiplicity of solid state switches S1-S4 that are connected in sequence to feed a common pulsed power load shown as inductor L and resistor R. Transformer T1 operates at a high frequency e.g. 10-100 kHz to increase power density. Each PFN 30 includes a 3-stage or greater network of capacitors and inductors as shown in FIG. 2A to produce a quasi-square wave of current $I_o$ at the PFN output 32 through each switch S1-S4 shown in FIG. 2B.

Figure 3:
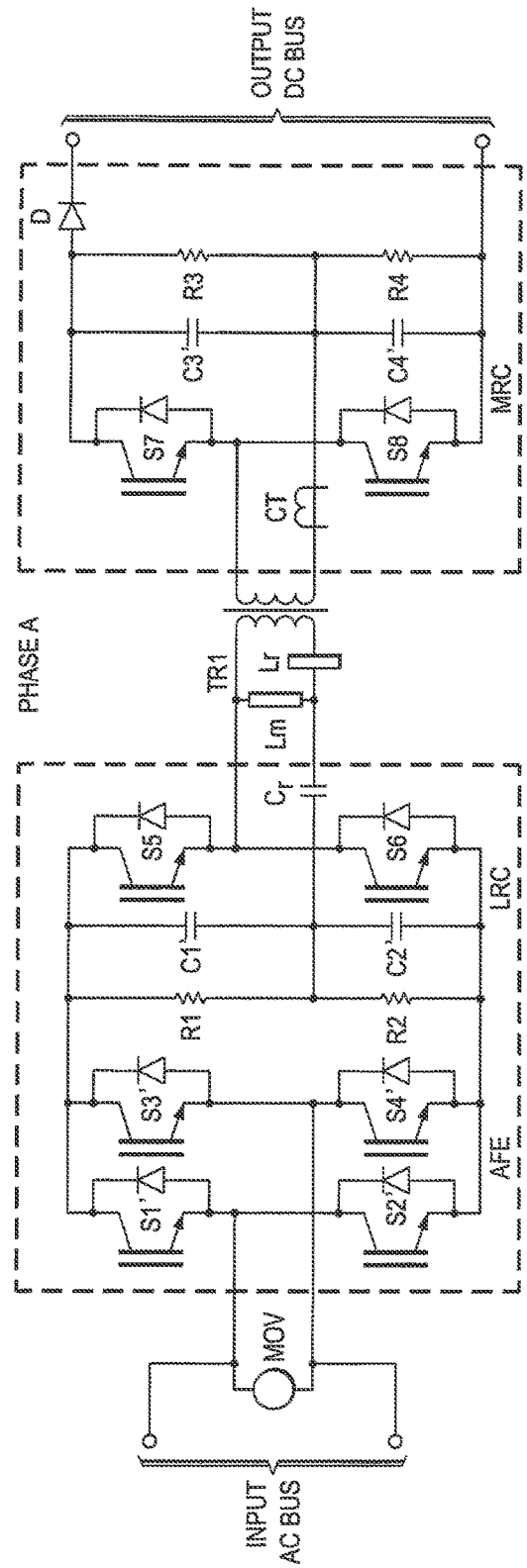
FIG. 3 illustrates a basic module of the AC input to DC output module.

FIG. 3 illustrates a basic module of an AC input to DC output module where an Active Front End (AFE) uses switches S1'-S4', LRC is a line side resonant converter, MRC is a machinery or output resonant converter, and TR1 is a resonant isolation transformer. The MOV is either a metal oxide varistor for surge suppression or a short circuit module.

Referring again to FIG. 1, each variable speed drive VSD includes a dynamic braking power resistor DB which is connected into the DC link bus of the respective VSD to effect dynamic braking of respective machine SM1 and machine SM2 in the event of a loss of AC line power or low receptivity of the AC line to power regeneration. Each resistor DB is switched into the DC link by a respective solid state switch GTO which may be, in a preferred embodiment, a gate-turn-off thyristor. In the event that a portion or all of the electrical capacitive energy on the PFN 30 is not utilized in the final load, the system 10 allows for rapid and efficient transfer of PFN stored energy from the PFN 30 to the transformer T1 to the AC-to-AC converter 22 and to SM2, and then to the VSD which decides if this regenerated power is to be transferred to the AC line 14 or dissipated in the dynamic braking resistor DB. A fundamental decision is made by the control system to limit the time period for which a PFN 30 is permitted to be at full or near full energy level due to dielectric breakdown considerations. Consequently, transferring energy in a rapid fashion from an unloaded yet fully charged PFN 30 to an intermediate or prime power source extends the lifetime and reliability of a PFN 30.

Each machine SM1 and SM2 is a permanent magnet synchronous machine or a wound field synchronous machine with a DC excited rotor, or a doubly fed induction machine with a polyphase rotor winding allowing the machine to operate over a wide range of synchronous speeds as determined by the fundamental frequency set by each VSD and choice of pole number. The VSDs are normally commanded to have identical frequency/speed and voltage/speed characteristics so that both machines SM1 and SM2 are started in unison and power the common flywheel FW. In FIG. 1, the system 10 has bidirectional control of the electro-chemical storage bank 18 and also bidirectional control of the PFNs 30 storage subsystem, which is a combination inductive-capacitive storage. Energy can be transferred easily between electrochemical storage bank 18 and PFNs 30 without effecting power fluctuations into the AC line 14 by use of the common shaft 12 linking the common flywheel FW. In a preferred embodiment, the flywheel FW is composed of a series of discs in tandem on the common shaft 12, and the bearing system is shared with machines SM1 and SM2.

The circuit and layout of system 10 in FIG. 1 allows controlled charging of the electro-chemical storage bank 18 from machine SM1, but limits the recharging rate from the machine SM1 to the electro-chemical storage bank 18 to a moderate rate and allows very rapid transfer of energy to and from the PFNs 30 to machine SM2 with equal rates for charging and safe retrieval of PFN energy in the event of aborted pulsed power or mission curtailment. Moreover, the system 10 allows rapid transfer of energy from the machine SM1 input to the machine SM2 output and reverse due to a common shaft layout. In a preferred embodiment, machine SM1 and SM2 deliver regenerated energy to the AC line 14 at equal rates.

The system 10 operates at 3 different voltages as an inherent advantage of the layout design:

1. Input power from main AC bus is at medium voltage, e.g., 4 kV to 15 kV, 3-phase.
2. Output of machine SM1 is at low voltage, e.g., 700 Volts, 3-phase for rectification at a voltage commensurate with a battery system at 1000 VDC.
3. Output voltage of machine SM2 is at medium voltage prior to the AC-to-AC converter 22 and is subsequently stepped up to a high voltage at transformer T1 for rectification at a voltage, e.g., 10 kV to 100 kV for application to PFNs 30 and pulsed DC inductive-resistive loads.

In a preferred embodiment, a mobile platform, such as a ship, may have two systems 10 identical in energy rating, but rotating in opposite directions and mounted on a common baseplate to minimize the net moment of inertia. The two systems 10 can produce a high voltage PFN in eight or more stages yielding high current and a square wave output if desired in the load with sequential firing of PFN output switch (thyristor) groups S1 to S4 to further effect output voltage current control with a dynamic L-R load.

Figure 4:
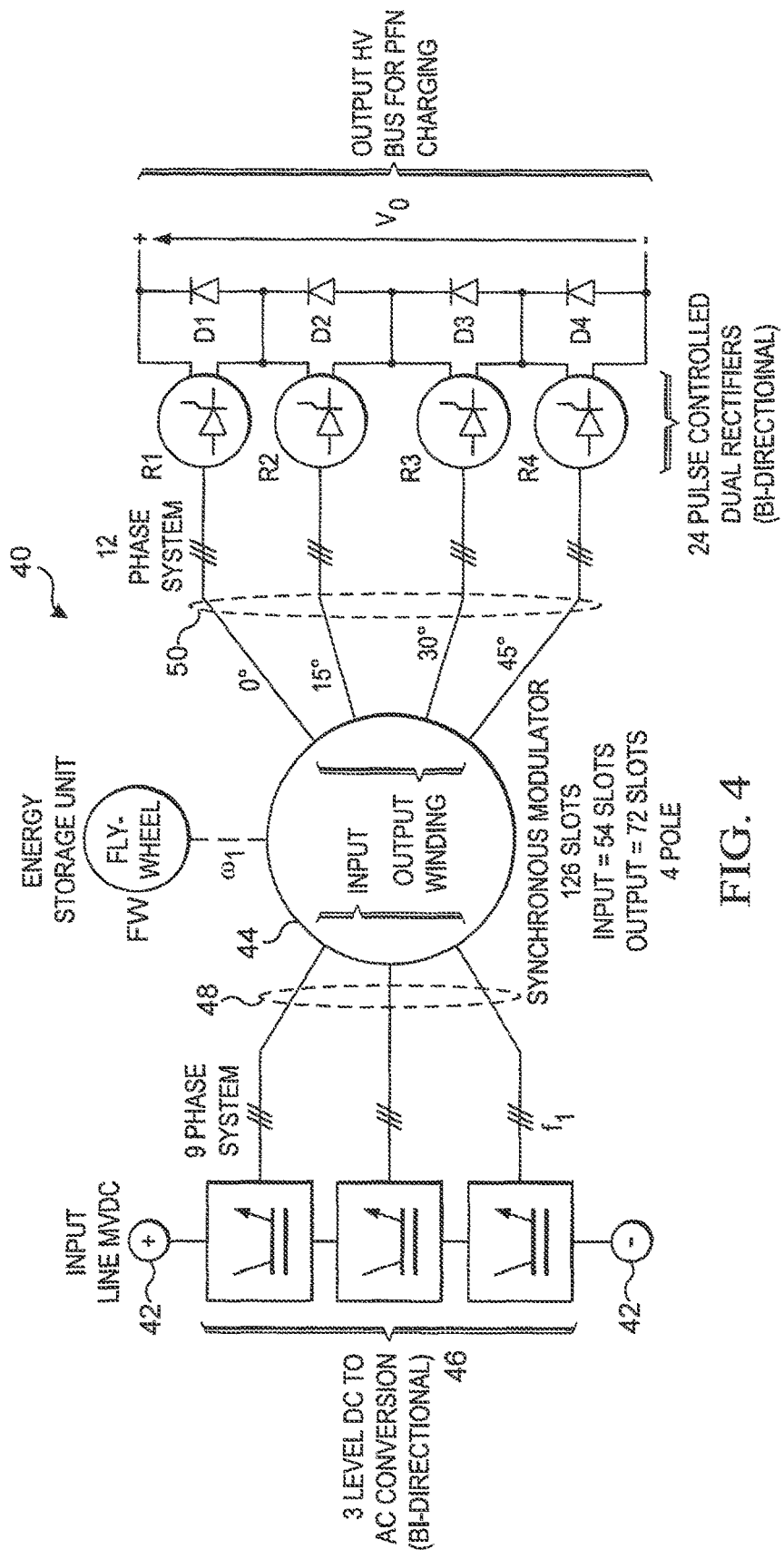
FIG. 4 shows a synchronous modulator (SM) sub-system of one machine fed by a medium DC bus converter in a 9-phase input system at frequency f1, and output in a 12-phase system at frequency f2 prior to rectification by a 24 pulse dual converter system with bidirectional power flow to and from the energy storage unit or line source.

FIG. 4 shows a SM sub-system 40 of one machine fed by a medium DC bus converter in a 9-phase input system at frequency f1, and output in a 12-phase system at frequency f2 prior to rectification by a 24 pulse dual converter system with bidirectional power flow to and from the energy storage unit FW or line source. A medium voltage DC (MVDC) input 42 feeds a SM 44 via bidirectional 3-level DC-to-AC converters 46 and three electrically isolated 3-phase primary winding inputs 48 which permit a compact and efficient machine design with bidirectional power control into the SM 44. Output windings 50 of the secondary on SM 44 are shown as a group of four electrically isolated wye groups which are spaced around the stator periphery and phased so that the A phase of each group is wound for 0, 15, 30 and 45 degrees phase separation, and thus constitute a 12-phase system with 24 pulse rectification. After rectification in controlled bidirectional rectifiers R1-R4, each rectifier is also shunted by respective power diodes D1-D4, and the four groups are placed in series so that the final output voltage $V_o$ is 4×1.35×the individual phase-to-phase voltage of each winding group. For example, if the individual phase windings are each 2000 Volts rms, the final output voltage $V_o$ is 10,800 VDC. This level of voltage can be efficiently applied to a PFN 30. The response time of the combined SM 44 and rectifier assemblies in this 24 pulse system is on the order of 10 micro-seconds, and thus, very rapid delivery of energy is possible without having high dv/dt or absolute transients on the machine windings. It should be obvious to one skilled in the art that the configuration in FIG. 4 can be applied to a SM with two or more primary winding levels and two or more secondary/output winding levels with a multiplicity of input DC-AC converters and a multiplicity of output controlled rectifiers to produce an output voltage with low ripple content. The disclosure further provides a means of switching out individual DC-to-AC converters 46 in the event of failure of one module without overloading either the machine input windings or the converter input maximum voltage limit.

Figure 2B:
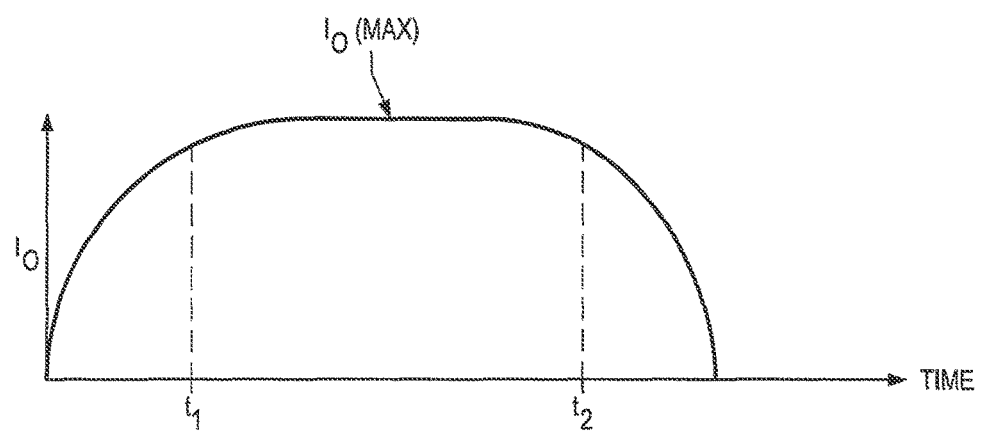
FIG. 2B illustrates a quasi-square wave of current $I_o$ at the PFN output through the circuit of FIG. 2A upon closing switch S1.
Figure 5:
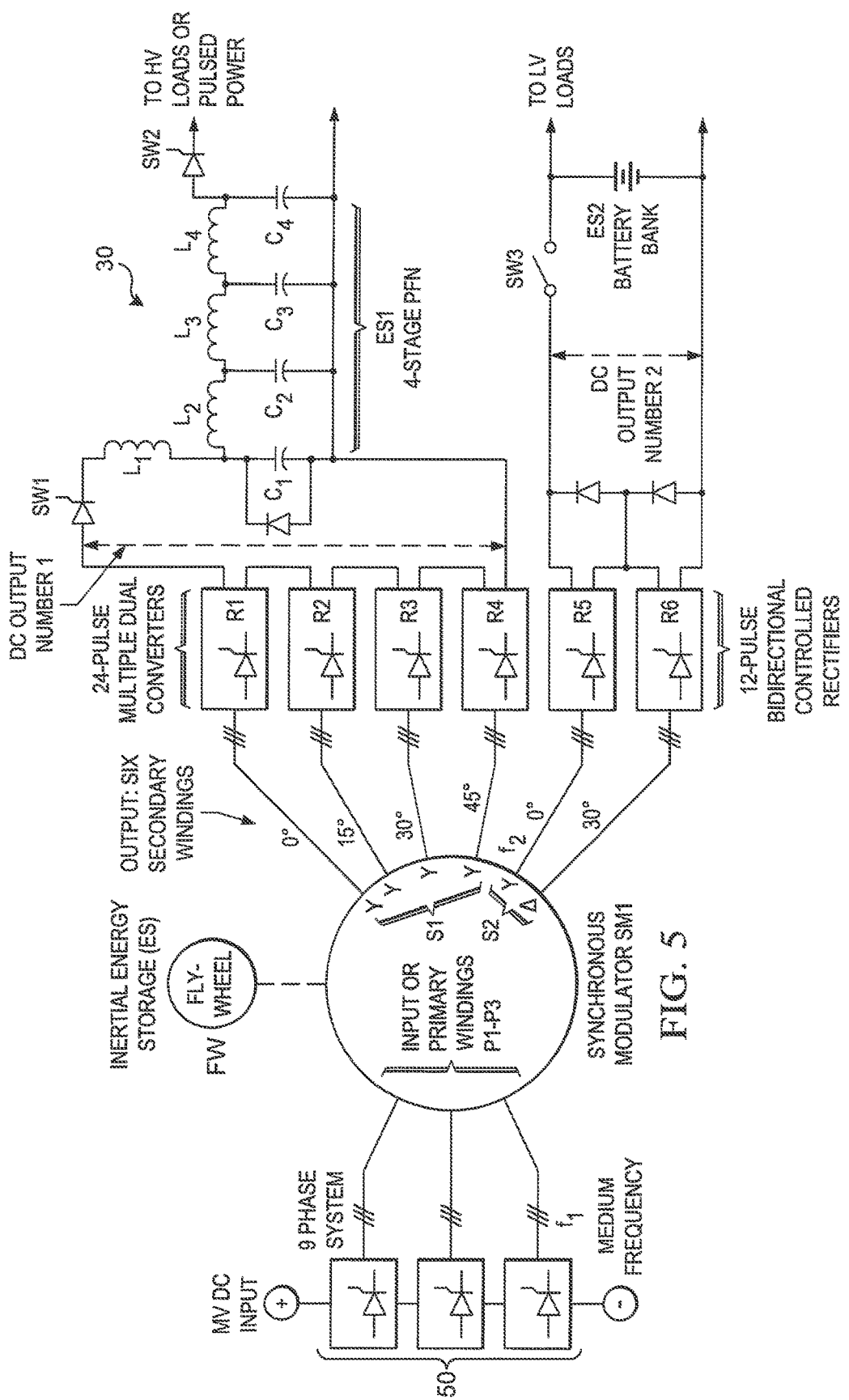
FIG. 5 shows a bidirectional machine SM1 with a 9-phase input winding and two secondary output winding groups constituting a 3-port SM.

FIG. 5 shows bidirectional machine SM1 with a 9-phase input winding and two secondary output winding groups S1 and S2 constituting a 3-port SM coupled to flywheel energy storage unit FW. The input source is a medium voltage DC source operating, for example, three DC-to-AC converters 50 to produce a 3-level medium frequency output frequency $f_1$. This 3-level converter 50 is coupled to three isolated 3-phase input winding groups P1-P3 of the SM1 primary arranged with a 40 degree phase shift between adjacent winding groups. Within the machine SM1, due to the reversal of each phase group in alternate poles, the effective input system has a 20 degree phase shift in the magnetomotive force (MMF) wave. Machine SM1 has two outputs in a 12-phase system at frequency $f_2$ prior to rectification by a 24 pulse dual converter system. Machine SM2 also has a parallel 6-phase output connected to a 12-pulse dual controlled rectifier. This provides for electro-chemical energy storage with bidirectional power flow to and from the energy storage unit flywheel FW or line source. The larger of the two secondary windings S1 is a 12-phase group arranged in four isolated 3-phase groups, whereby there is 15 degree phase shift between similar phases of adjacent groups. All four winding groups have equal MMF and pole pitch and voltage output level. These are rectified by four sets of bidirectional controlled rectifiers R1-R4, where each of rectifiers R1-R4 are dual converter bridges capable of both forward and reverse power flow. The PFN 30 is charged by the series combination of rectifiers R1 thru R4 and electronic switch SW1, and discharged by electronic switch SW2. A constant current waveform can be delivered to the load through use of the 4-stage PFN 30. Four output shunt diodes provide a bypass circuit in the event of one or more bridge converters being non-functional and allow for series aiding to produce DC Output No. 1 which directly charges the PFN 30. The PFN energy is designated as ES1 and as shown is a capacitive-inductive PFN with three stages to yield a quasi-square wave current output when discharged into an R-L load as shown in FIG. 2B.

The synchronous modulator SM1 in FIG. 5 is a bi-directional electrical machine with separate input and output windings built on a common frame with e.g. with 162 stator slots. In this embodiment, the details are:
 a. Input winding, 4 pole, 9-phase, 3 isolated primaries, in a total of 54 stator slots with 1.5 slots/pole/phase,
 b. Output winding No. 1, 4 pole, 12-phase in 72 slots with 1.5 slots/pole/phase with 15 degree phase shift between windings with all 4 windings groups in wye configuration,
 c. Output winding No. 2, 4 pole, 6-phase in 36 slots with 1.5 slots/pole/phase with 30 degrees phase shift between windings arranged as a wye-delta group.

Figure 6:
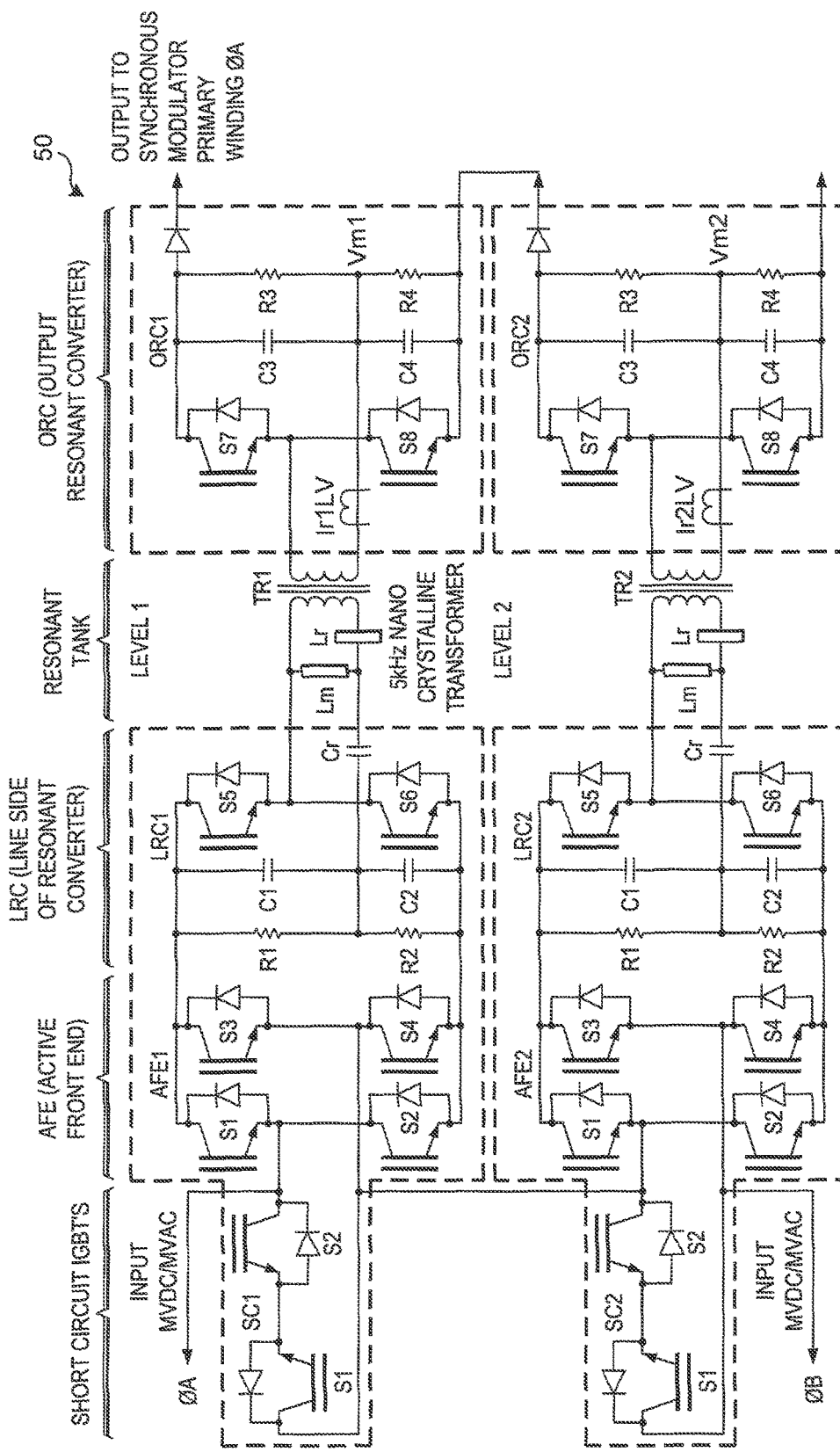
FIG. 6 shows one converter which transforms the medium voltage DC to the medium frequency $f_1$ polyphase AC for powering the machine SM1.

FIG. 6 shows one example of converter 50 which transforms the medium voltage DC to the medium frequency $f_1$ polyphase AC for powering the machine SM1. FIG. 5 shows three stages of input converters 50 in series, whereas FIG. 6 shows a detailed schematic of one phase with two identical stages in series for simplification. Multiple converters in series allows the system to use commercially available insulated-gate bipolar transistors (IGBTs) with, for example, 3.3 kV blocking voltage ratings for the active front end (AFE) converter whereby the system line voltage may be as high as 15.0 kV rms. The AFE is necessary for a regenerative converter. Each converter has a DC link and filter capacitors C1-C2 which then feeds the line resonant converter (LRC). In the LRC1 and LRC2, switching devices S5-S6 oscillate at medium to high frequency e.g. 5 kHz-100 kHz to power the intermediate transformers TR1 and TR2, which are lightweight nano-crystalline units in the preferred embodiment. Capacitor Cr is the resonant link capacitor and is dependent on the transformer magnetizing inductance Lm and self-inductance Lr for determination of the resonant frequency and kVAR sizing. The output of each transformer is monitored for the controller by current through sensors Ir1 and Ir2 before the current goes to output switching devices S7-S8 and output filter capacitors C3-C4. Voltage output for the control system is monitored at nodes Vm1 and Vm2 established by voltage divider R3-R4. In the event of a failure of an input bridge, IGBTs SC1 and SC2 short-circuit or bypass one converter input and redistribute the applied line voltage amongst remaining AFEs to allow continued operation. The output resonant converters ORC1 and ORC2 are wired in series to allow for high voltage output to the electrical machinery or synchronous modulator primary windings at variable-voltage variable-frequency (VVVF) operation over a frequency range to permit fast control of the inertial energy storage.

Figure 7:
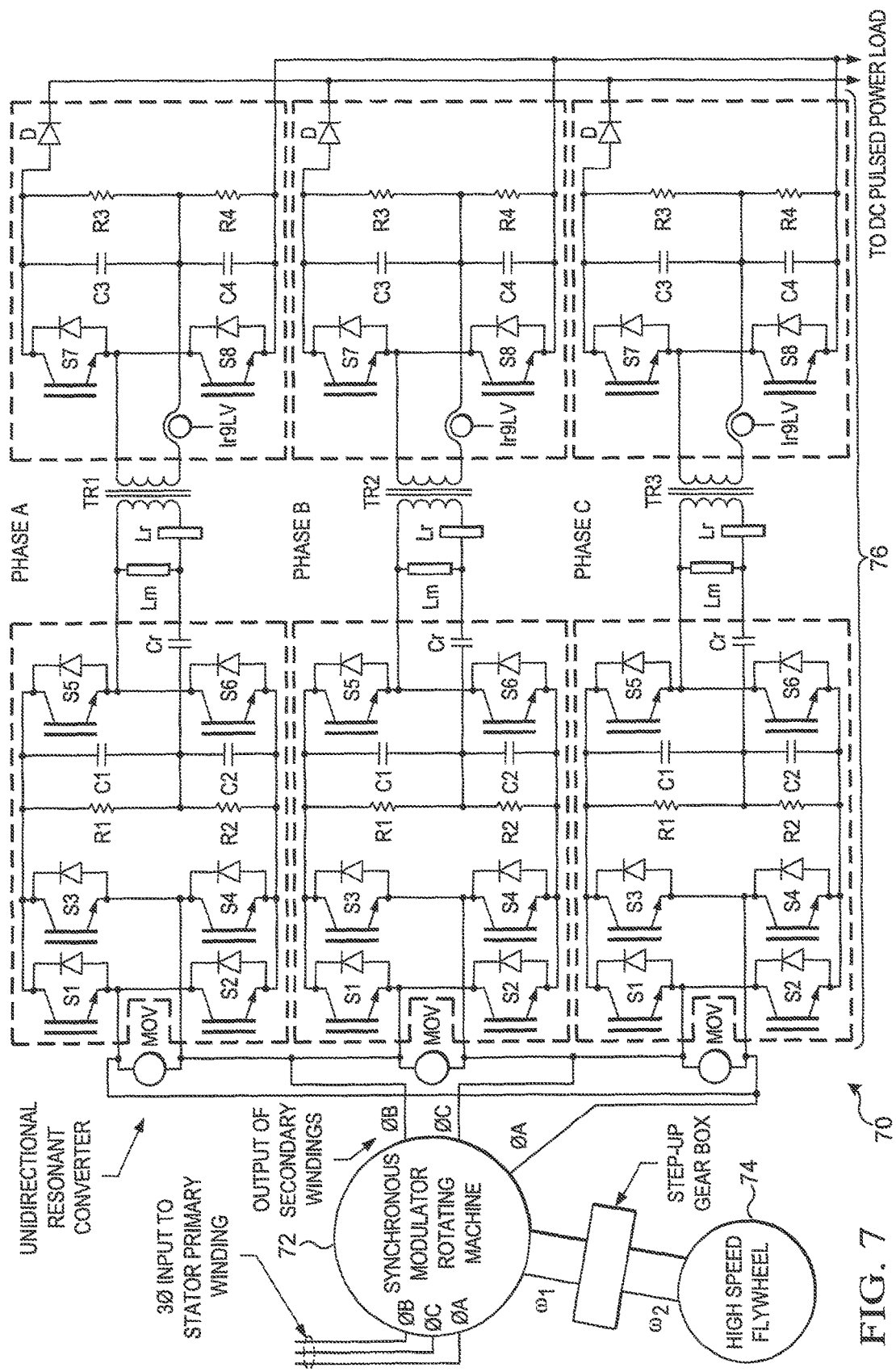
FIG. 7 shows a two-port bidirectional SM in a unidirectional circuit configured to be used as variation of the overall arrangement in FIG. 1.

FIG. 7 shows a unidirectional sub-system 70 including a two-port bidirectional rotating machine SM 72 configured to be used as variation of the overall arrangement 10 in FIG. 1. Energy storage other than load energy storage is strictly from the inertial mass/FW 74. The SM/FW has an AC input, and the SM secondary winding feeds three levels of output resonant converters 76 each with its own isolation transformer. Transformers TR1, TR2 and TR3 are medium to high frequency units and permit outputs to be paralleled for high current pulsed DC. Note that the particular circuits of these converters can also be substituted with an AC link converter 102 as shown in FIG. 10.

Figure 8A:
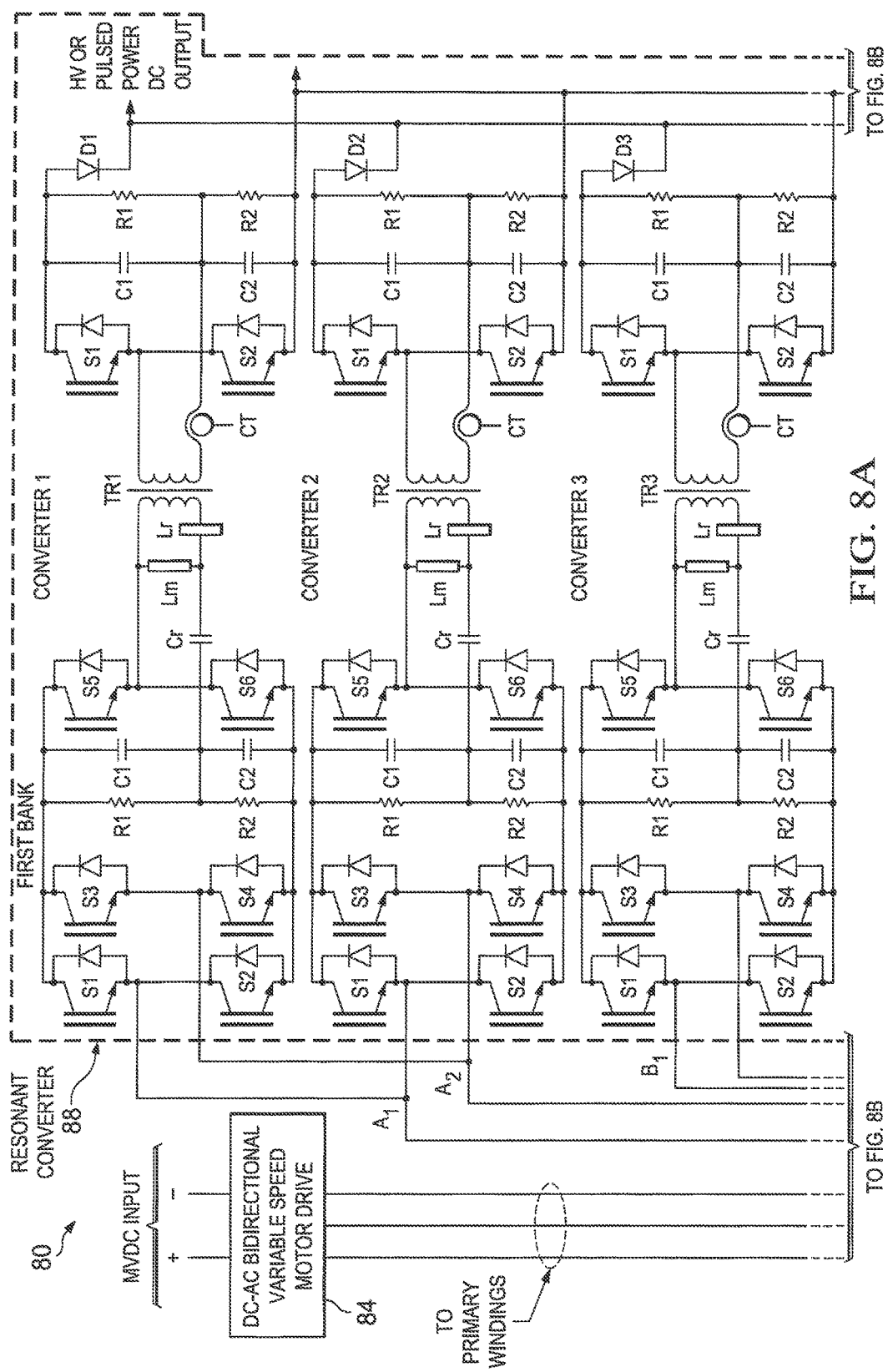
FIGS. 8A and 8B show a three-port SM/inertial energy storage circuit with improved galvanic and pulse load isolation intended for very high current applications.
Figure 8B:
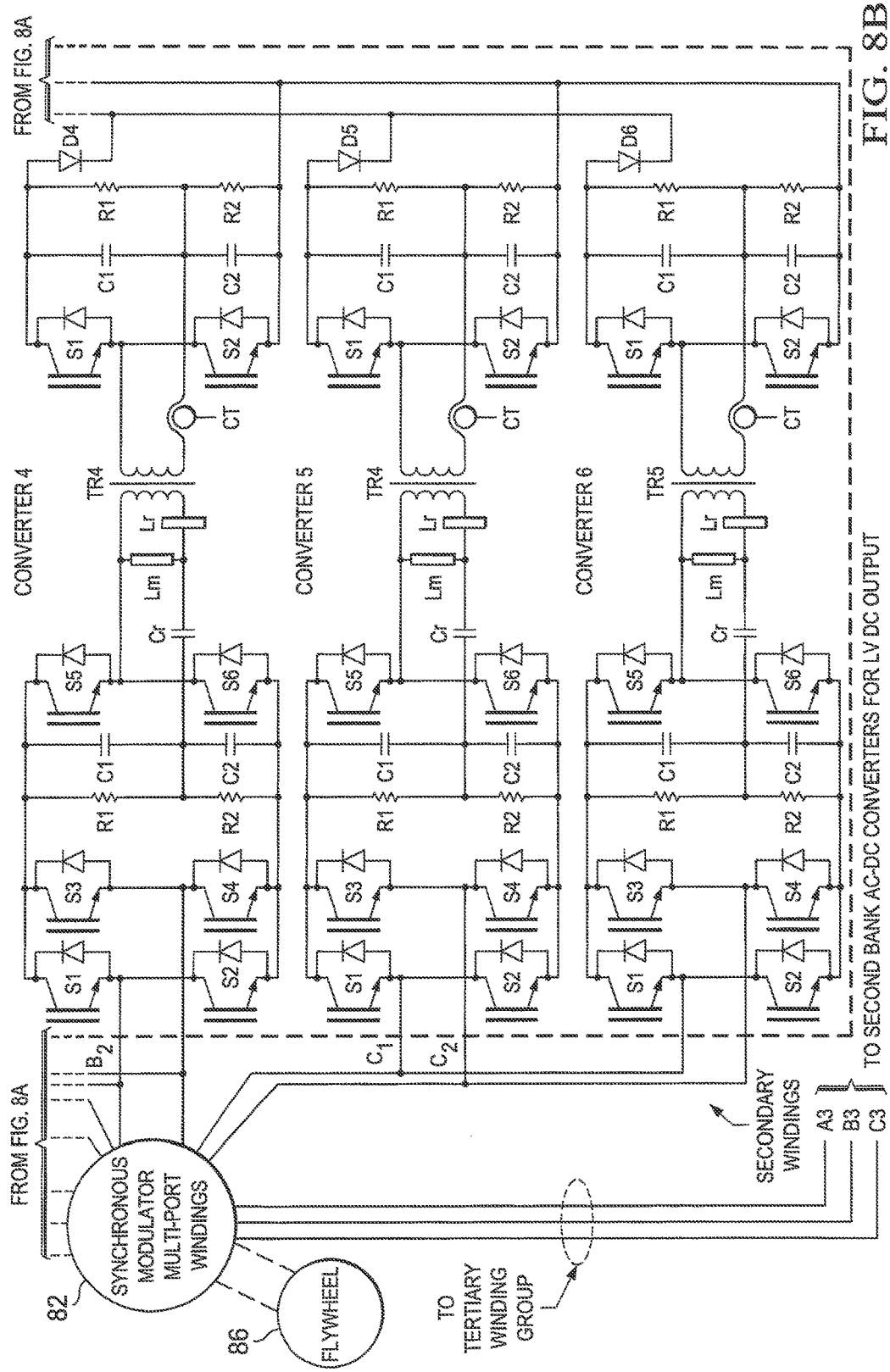

FIGS. 8A and 8B show a three-port SM/inertial energy storage sub-system at 80 with improved galvanic and pulse load isolation mainly intended for very high current applications. A SM 82 is fed from a MVDC source thru a variable frequency motor drive 84 to charge/discharge an inertial storage unit FW 86, and the output has 6 phases in 9 leads. The first bank is fed by 3 galvanically isolated phase windings and the second bank is fed by a delta connected tertiary group of lower voltage output. In this preferred embodiment, the variable frequency motor drive 84 is bidirectional which allows for regenerative braking of flywheel stored energy. Six of the output phases (terminals A1, A2, B1, B2, C1, C2) are used to power 6 modular active front-end converters and intermediate resonant converters 88 to deliver high current to a pulsed load with short rise time due to the low inductance of this circuit. The three-phase output of the SM 82 (tertiary winding) designated A3, B3, C3 are used to power low voltage (LV) loads such as an electro-chemical storage bank. The system provides for bidirectional energy flow from a LV load or a high voltage (HV) load to the inertial storage unit 86 or to the MVDC line.

Figure 9A:
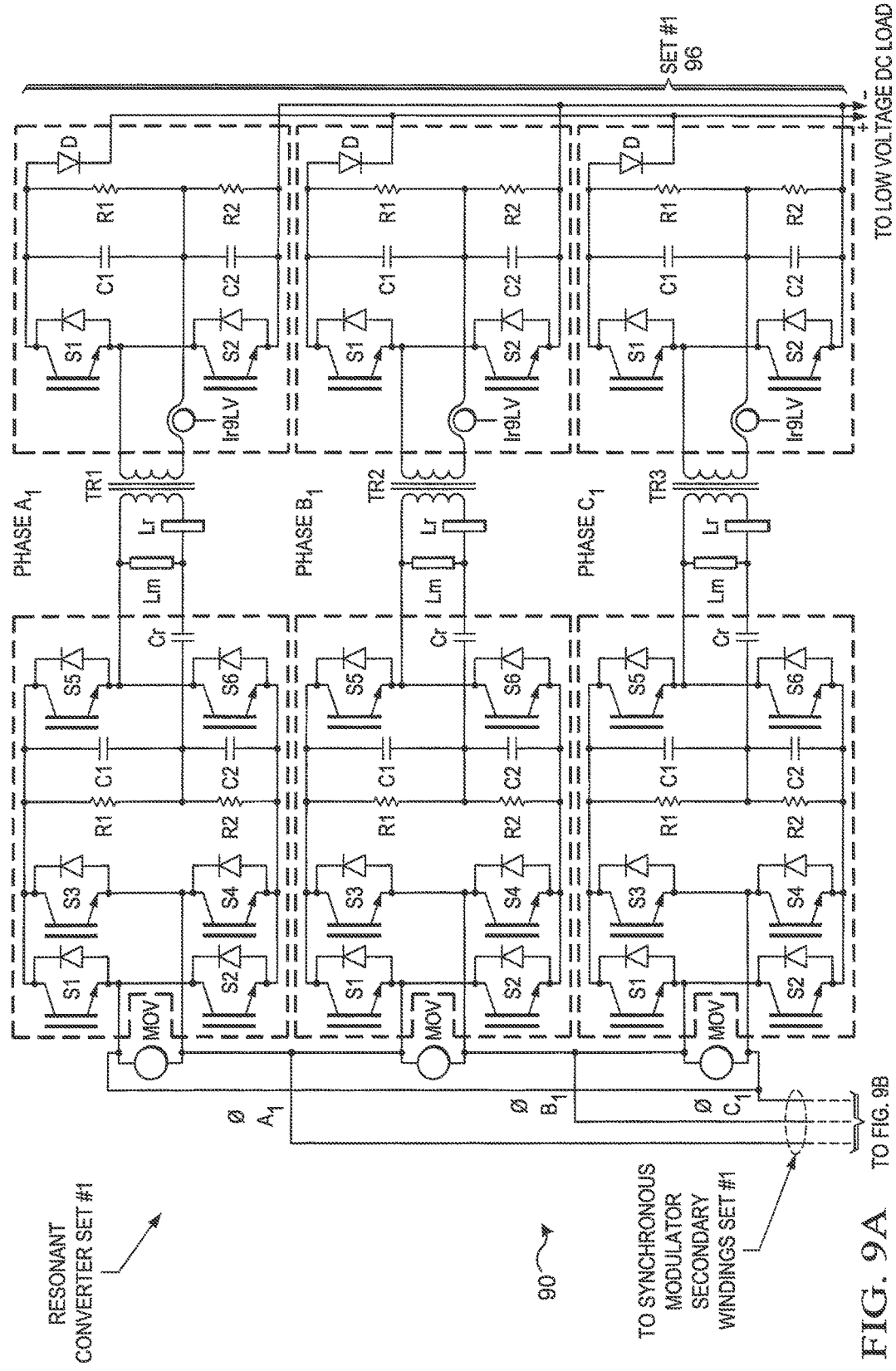
FIGS. 9A and 9B show a three-port synchronous modulator sub-system of a two machine system, whereby the input power of the SM is derived from a DC-to-AC frequency converter and the machine is wound with two output windings.
Figure 9B:
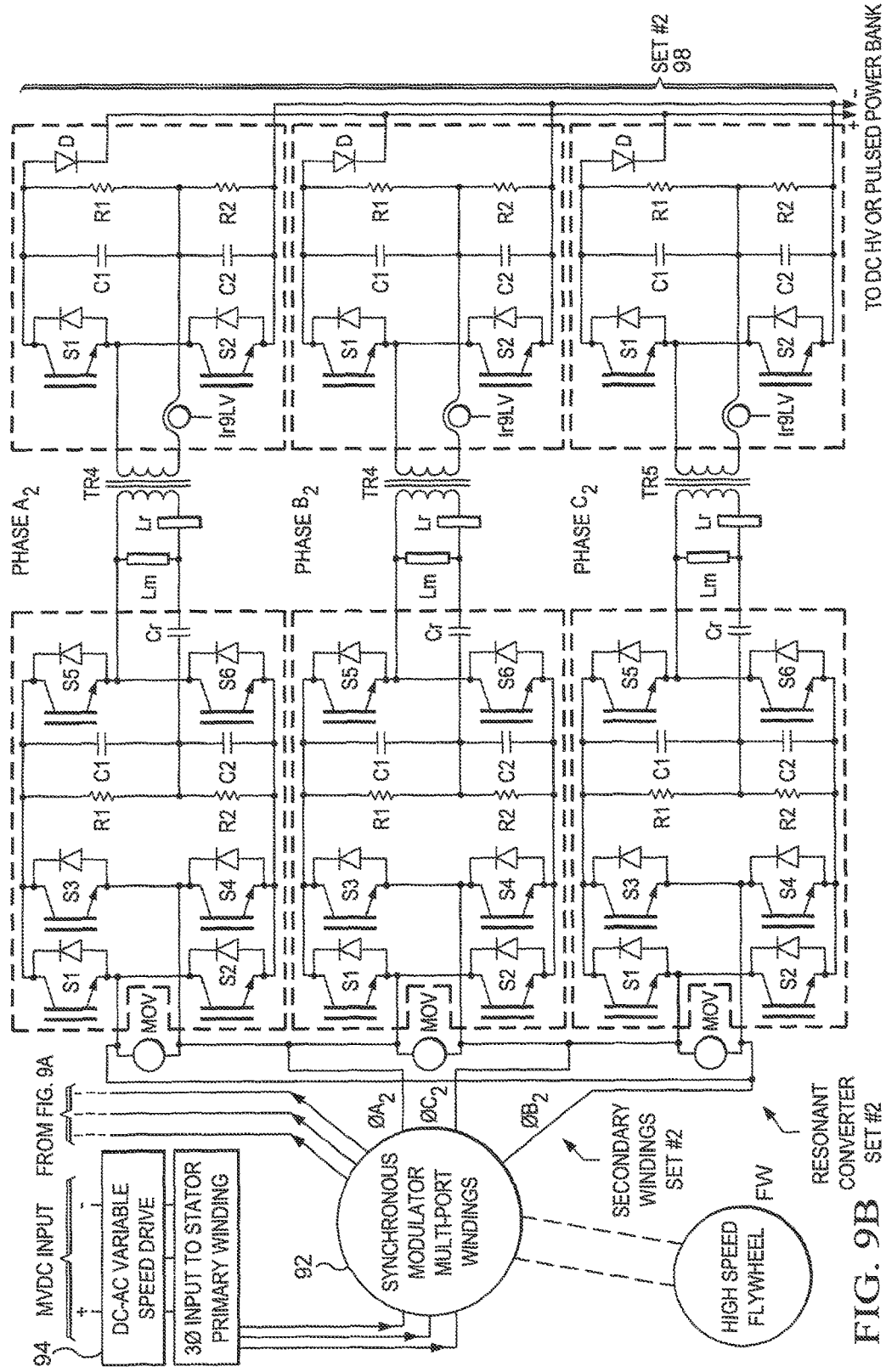

FIGS. 9A and 9B show a three-port synchronous modulator sub-system 90 of a two machine system, whereby the input power of SM 92 is derived from a DC-to-AC frequency converter 94 and the machine is wound with two output windings. Output winding 1 (terminals A1, B1, C1) of SM 92 feeds a set of multiple AC-to-DC resonant power converters 96 each with a low voltage DC output feeding a battery bank or other LV energy storage device with total galvanic isolation from other subsystems. Output winding 2 (terminals A2, B2, C2) of SM 92 feeds a set of multiple AC-to-DC resonant power converters 98 with high voltage DC output and total galvanic isolation from other subsystems. Converters 98 may charge/discharge a pulse forming network. The resonant frequency and time constants of the resonant power converters 96 are different from the resonant frequency and time constants of resonant power converters 98.

Figure 10:
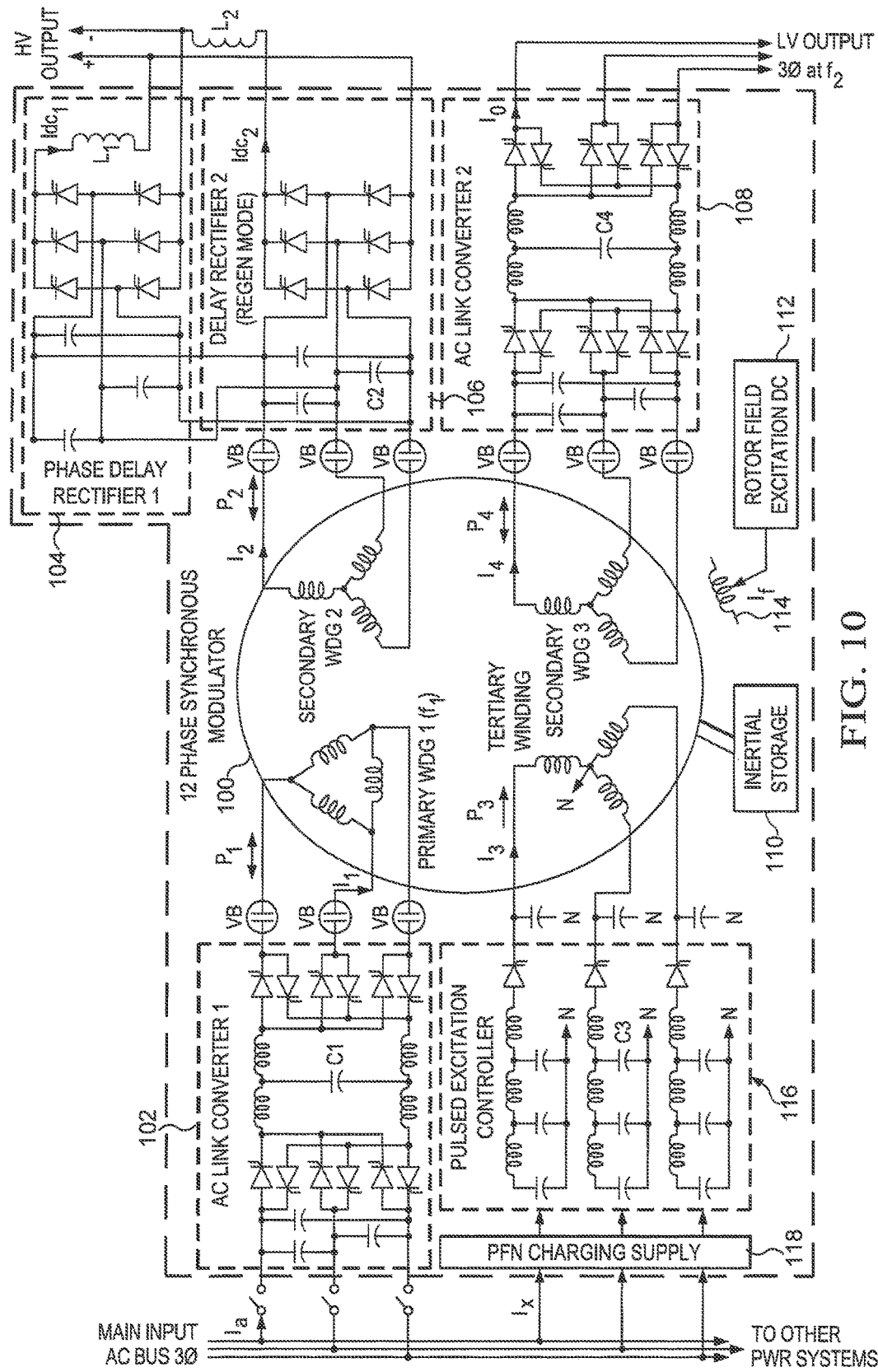
FIG. 10 shows a four-port 12-phase SM as a subsystem of a larger multiple machine system, whereby the primary windings are fed from an AC source through an AC Link frequency converter and provides both low voltage and high voltage outputs for pulsed loads.

FIG. 10 shows a four-port 12-phase SM 100 as a subsystem of a larger multiple machine system, whereby the primary windings are fed from an AC source through an AC link frequency converter 102. There are no transformers in this system 100 and galvanic isolation from line to load is provided entirely by the galvanic isolation of SM 100. The secondary winding No. 2 feeds a dual reversing thyristor converter consisting of phase delay rectifiers 104 and 106 which allow bidirectional power flow to and from the HV load. An AC link converter 108 derives variable frequency variable voltage power from the SM secondary winding 3 and converts this to regulated voltage/regulated frequency (f2) power for use in subsystems, such as radar or sonar. AC link converter 108 is bidirectional and can regenerate power to the SM 100 and inertial storage 110, or to the AC main source if necessary. The SM 100 has conventional rotor field DC excitation 112 provided by rotor winding 114 for powering steady state loads such as secondary winding No. 3. However, in addition to regular DC rotor field excitation, the SM 100 has a polyphase tertiary winding on a common stator structure which is powered by a pulsed excitation controller and a 3-stage pulse forming network 116 which provides super-excitation at very fast ramp rates to enable the SM secondary winding No. 2 to power the HV loads with micro-second rise times. PFN 116 is charged by PFN supply 118 from the main AC polyphase input supply.

Not shown in FIG. 10, the HV output is intended to power a pulse forming network which provides a constant-current DC waveform for a series R-L load as shown in FIG. 1. The advantage of this scheme is that without transformers, the overall system is very compact and efficient. A complete system comprises at least two synchronous modulators & inertial storage sets rotating in opposite directions to reduce the gyroscopic moment to a minimum, and machine internal voltages stresses are reduced to allow two or more machine sets to be put in series-aiding to yield maximum high voltage DC output depending on the nature of the load. Alternately, two or more machine sets can be wired with the HV outputs in parallel to provide high current or redundant operation of pulsed loads.

Figure 11A:
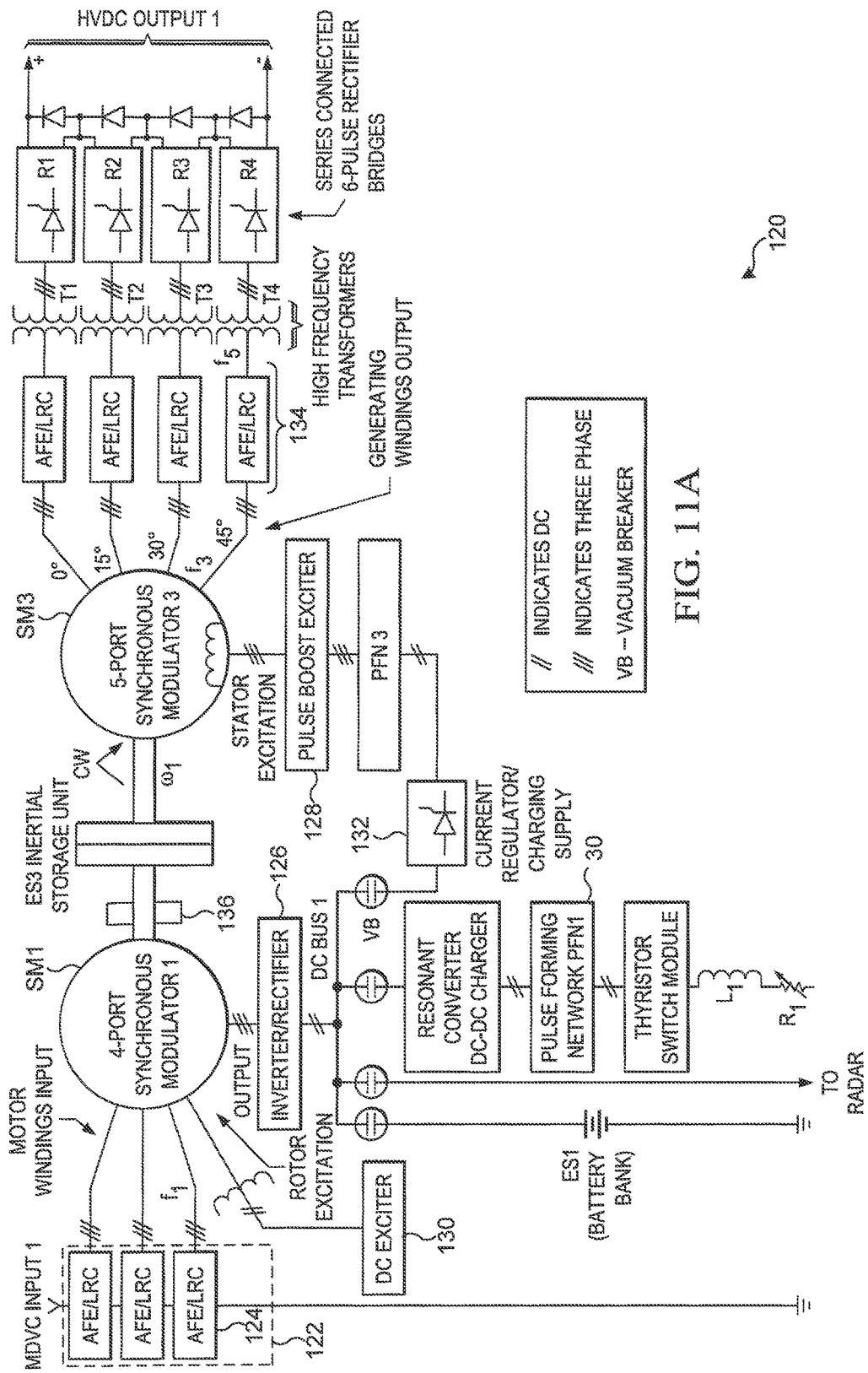
FIGS. 11A and 11B show a preferred embodiment of a system having dual energy storage units with four synchronous modulators, dual HVDC outputs for pulsed power loads, and dual LVDC outputs such as to power radar and lower power PFN loads.
Figure 11B:
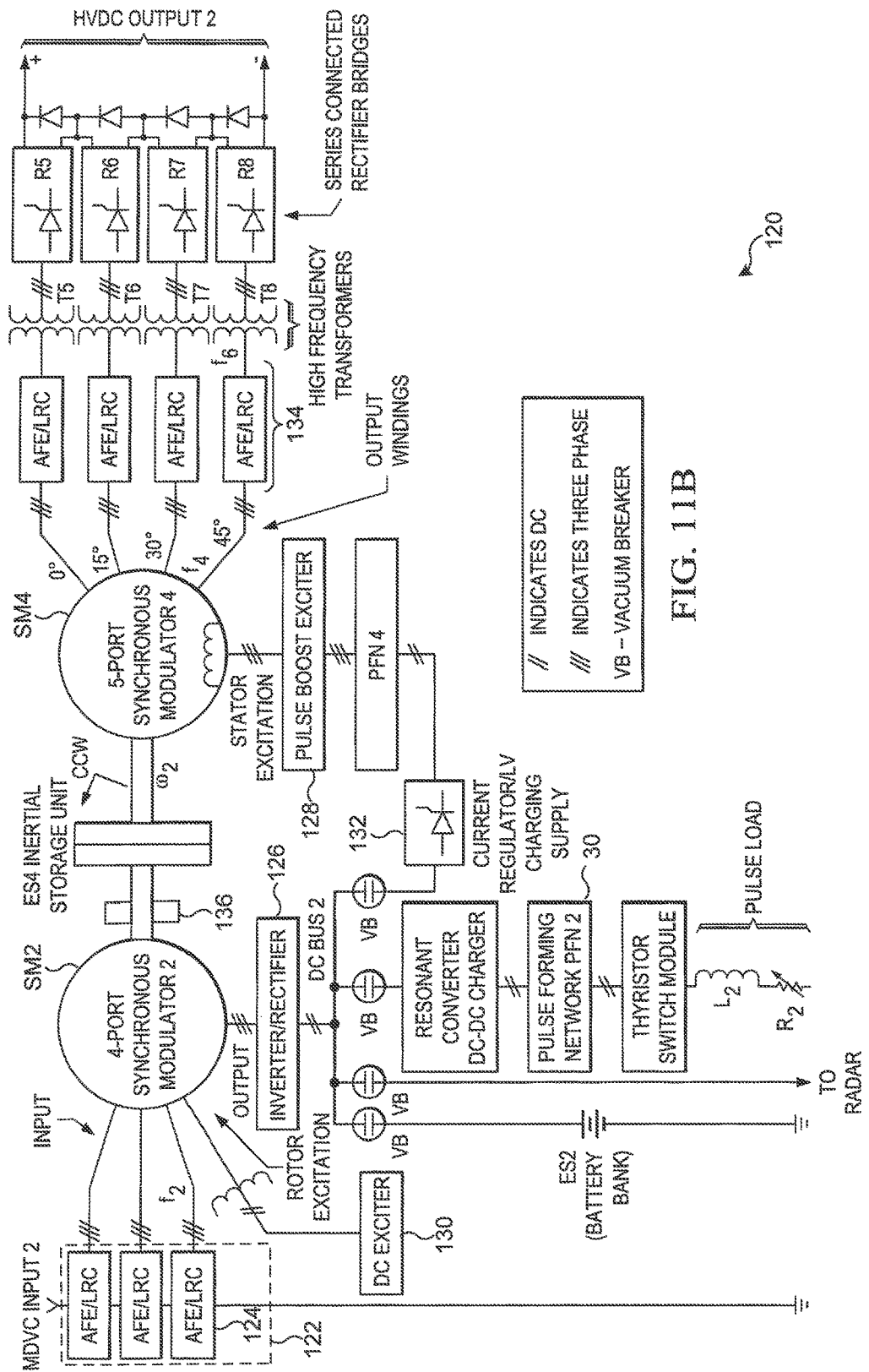

FIGS. 11A and 11B show a preferred embodiment of a system 120 having dual energy storage units with 4 synchronous modulators (SM1, SM2, SM3, SM4), dual HVDC outputs for pulsed power loads, and dual LVDC outputs such as to power a stochastic load, such as a radar, and lower power PFN loads. Two identical energy storage units form system 120 to balance inertia, although only one energy storage unit may be utilized in some applications. Machines SM1 and SM2 may be powered by a separate medium voltage DC source (MVDC) which is converted to polyphase AC voltage at a variable frequency f1 and f2, respectively, by a respective array 122 of multi-level DC-to-AC converters 124. Alternatively, each of machines SM1 and SM2 may be powered by a common MVDC source via the respective arrays 122. In the example of FIGS. 11A and 11B, each array 122 is a 3-level array producing a total of 9 phases for input to the SM1 and SM2 primary motor windings. Machines SM1 and SM2 are each 4 port machines having 3 input ports (galvanic isolated), and one output polyphase port which is connected to a respective rectifier/inverter subsystem 126 producing a constant DC voltage at respective DC Bus 1 and DC Bus 2. Each of these two DC busses charge or power four principal loads. It is noted that the DC busses may be configured to power more or less principal loads depending on the application. Note ω1 is the shaft speed (clockwise) of the shaft connected between machines SM1 and SM3, and ω2 is the shaft speed (counterclockwise) of the shaft connected between machines SM2 and SM4.

Novel aspects shown in FIGS. 11A and 11B include that the machine SM1, or the energy storage ES1, provides LVDC for the high response or high rep-rate excitation via pulse boost exciter 128 to the machine SM3 in a tandem mode, and shares a common inertial stored energy ES3 Likewise, machine SM2, or the energy storage ES2, provides LVDC for the high response or high rep-rate excitation via respective pulse boost exciter 128 to machine SM4 in a tandem mode, and shares a common inertial stored energy ES4. It is an important aspect of this disclosure that machines SM1 and SM2 each have conventional DC rotor excitation provided by a respective DC exciter 130 typical of a wound-field synchronous machine, whereas machines SM3 and SM4 each have a tertiary polyphase winding on the stator which is tuned to the inductance and capacitance of PFN3 and PFN4 to allow for very fast rise times of the boost exciter current and consequently produce an output waveform with fast rise times in four output ports. Current from the DC Bus 1 and DC Bus 2 is regulated by respective current regulator 132. The generator outputs of machines SM3 and SM4, as shown in FIGS. 11A and 11B, are arranged in a phase shift mode whereby each group of outputs is shifted 15 degrees from the adjacent group and creates an overall 12-phase balanced output. Each one of these output groups is fed to an active front end (AFE) and line resonant converter (LRC) 134 at frequency f3 and f4, respectively. The output frequencies of the AFE/LRC converters 134 are f5 and f6, respectively, which are higher than frequencies f3 and f4, respectively. Transformers T1 through T8 are connected to each respective LRC and step up the voltage. Series connected 6-pulsed rectifier bridges R1-R4 rectify the voltage and produce the respective HVDC output 1 and HVDC output 2. Gearboxes 136 may be provided on each of the shafts connecting machine SM1 to machine SM3 and machine SM2 to machine SM4 if desired to increase speed of the shafts coupled to machines SM3 and SM4. Machines SM1 and SM2 may also be permanent-magnet synchronous machines whereby the DC exciter 130 is eliminated.

Figure 12:
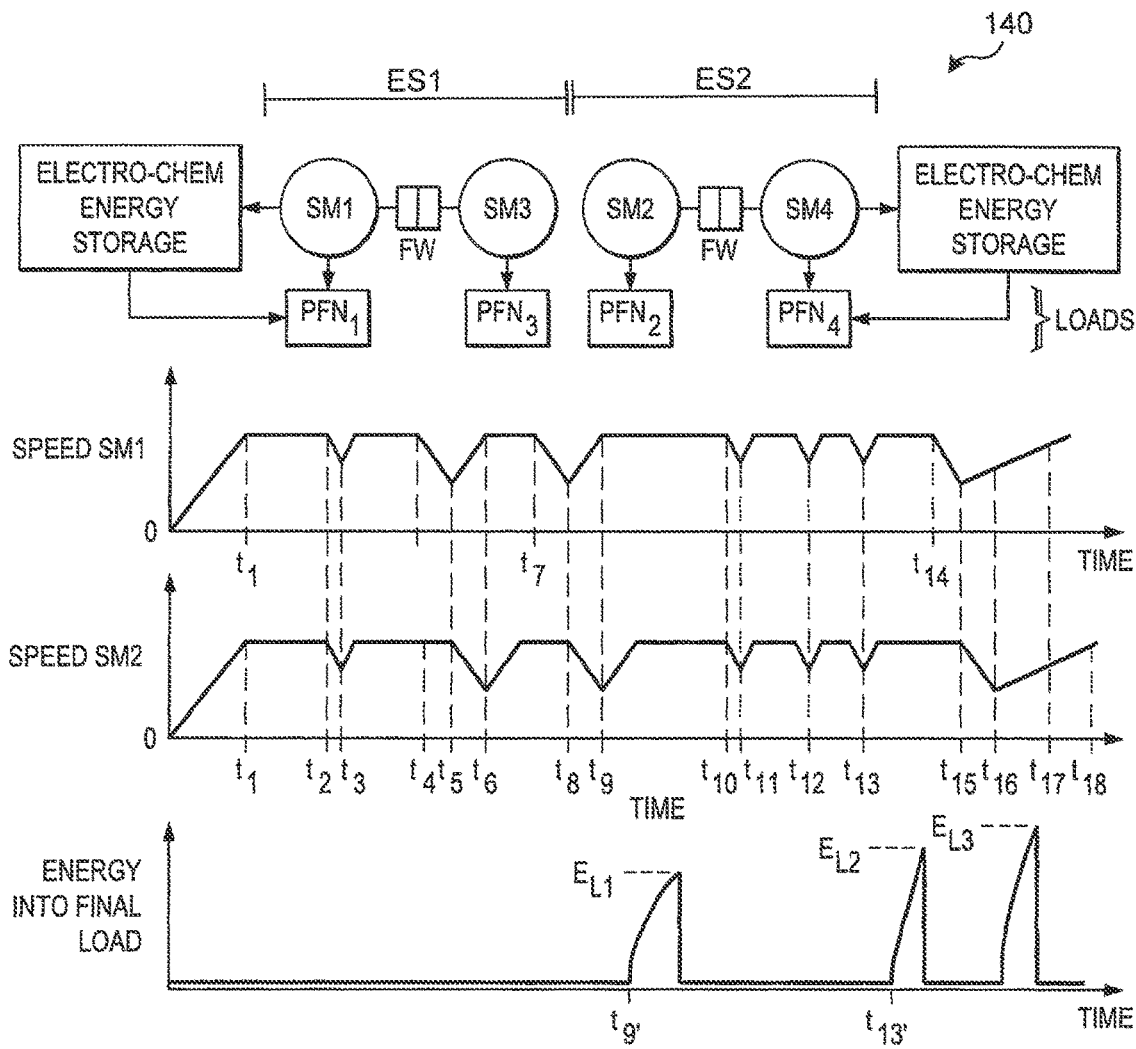
FIG. 12 shows a method of simultaneously controlling the two inertial energy storage sets.

FIG. 12 shows a method 140 of simultaneously controlling the two inertial energy storage sets termed ES1 and ES2. Set ES1 has direct shaft connection to the SM1 and SM3 synchronous modulators. Set ES2 has direct shaft connection to the SM2 and SM4 synchronous modulators. FIG. 12 illustrates two quasi-synchronous sets of inertial energy storage system combined with electro-chemical energy storage for multi-function hybrid energy storage feeding system of pulse forming networks.

By way of example, there are representative 16 different blocks for energy transfer in a bidirectional mode and each time period is described as follows showing speed (proportional to the square root of energy) of the inertial storage as a function of time:

0-T1: Both ES1 and ES2 are charged from line source at identical rates and in unison.

T1-T2: Both ES1 and ES2 are held constant at their full rating of speed and energy storage.

T2-T3: Both ES1 and ES2 are discharged simultaneously at the same rate into two identical electrochemical storage units down to approximately 71% of the top speed.

At T3 both sets are recharged from source or line power at identical rates and again escalate in speed up to maximum speed and energy rating.

T4-T5: Set ES1 is discharged at its maximum rate down to approximately one-half of maximum speed or 25% of its peak energy rating, discharging this energy into a pulse forming network load PFN1, while in the same period ES2 is kept at constant maximum speed.

T5-T6: Set ES2 is now discharged at its maximum rate down to approximately one-half of maximum speed or 25% of its peak energy rating, discharging this energy into a pulse forming network load PFN2, while in the same period ES1 is allowed to recharge from the line power or source from 25% stored energy point up to 100% stored energy.

T6-T7: Set ES2 is recharged from line to 100% energy level subsequent to set ES1.

T7-T8: Set ES1 is discharged to 25% energy level into load PFN3.

T8-T9: Set ES2 is discharged into load PFN4 down to 25% energy level while set ES1 is being recharged from line in the same period.

At T9 set ES2 is recharged from source or line power and also at T9 the two electrochemical energy sources are supplying high power to load PFN1, PFN2, PFN3 and PFN4 and are being depleted in this period.

Between T9 and T10 the four PFNs are fired or discharged into their respective loads with total energy EL1

T10-T11: Both ES1 and ES2 are discharging one half of their stored energy into the electrochemical storage units leaving both ES1 and ES2 at 71% speed.

At T11 both ES1 and ES2 are in recharge mode from line or source. This period gives the electrochemical cells time to become thermally stable.

T11-T12: Both ES1 and ES2 are discharged into electrochemical source.

At T12 and T13 the same cycle as used at T11 is repeated so that at T13 the electrochemical cells have attained 100% of maximum allowable stored energy. At T13' the electrochemical storage units discharge into the 4 PFNs which are sequentially fired in a short period so that total energy EL2 is delivered to the final load. The system allows for the ES1 and ES2 to also discharge into two or more PFNs to augment the energy from the electrochemical storage units to boost voltage (and total energy) on the PFNs beyond and above what is obtained from the electrochemical source.

T13-T14: The electrochemical storage units are both rapidly discharged into loads PFN1, PFN2, PFN3 and PFN4 and then the PFNs are subsequently fired delivering load energy EL3.

AT T14: The ES1 is rapidly discharged to the 50% speed (25% stored energy) into two PFN loads PFN1 and PFN3 until time T15.

T15-T16: Discharge of ES1 is complete and set ES2 starts its discharge to 50% speed (25% stored energy) into PFN2 and PFN4. At T15 set ES1 starts its recharge cycle from line source but at a slower rate, e.g., one-half rate, than at T5 or T8, to limit the power and current pulsations on the source generation system.

At T16, set ES2 starts its recharge cycle from line source but at a slower rate, e.g., one-half rate, than at T6 or T9, to limit the power and current pulsations on the source generation system.

At T17, set ES1 is finished in recharge mode from line.

At T18, set ES2 is finished with its recharge mode from line. In this arrangement, the peak energy into the final load is controllable as shown by three distinct levels attained as indicated in FIG. 12 by peak values $E_{L1}$, $E_{L2}$ and $E_{L3}$.

Figure 13:
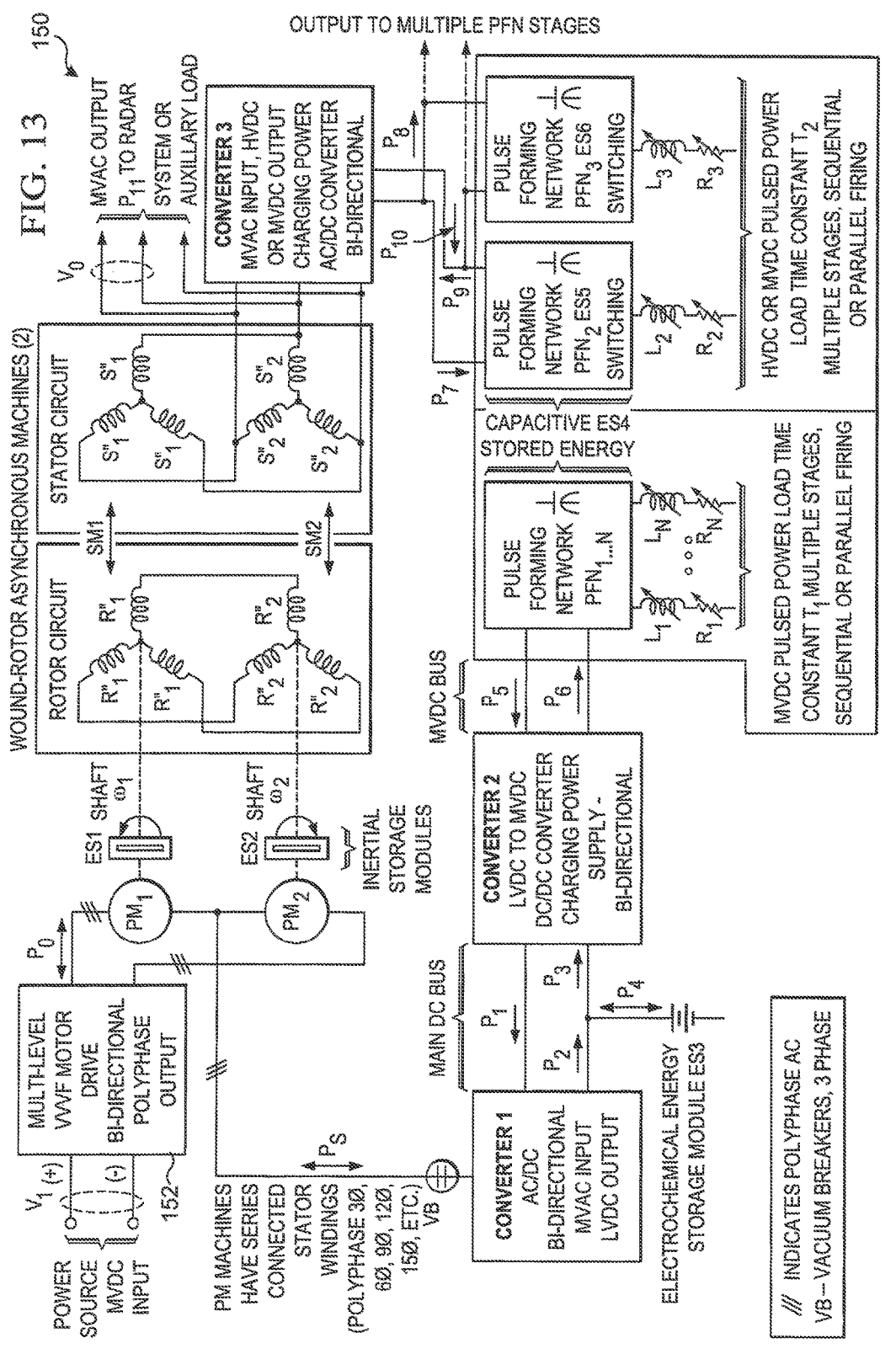
Figure 14:
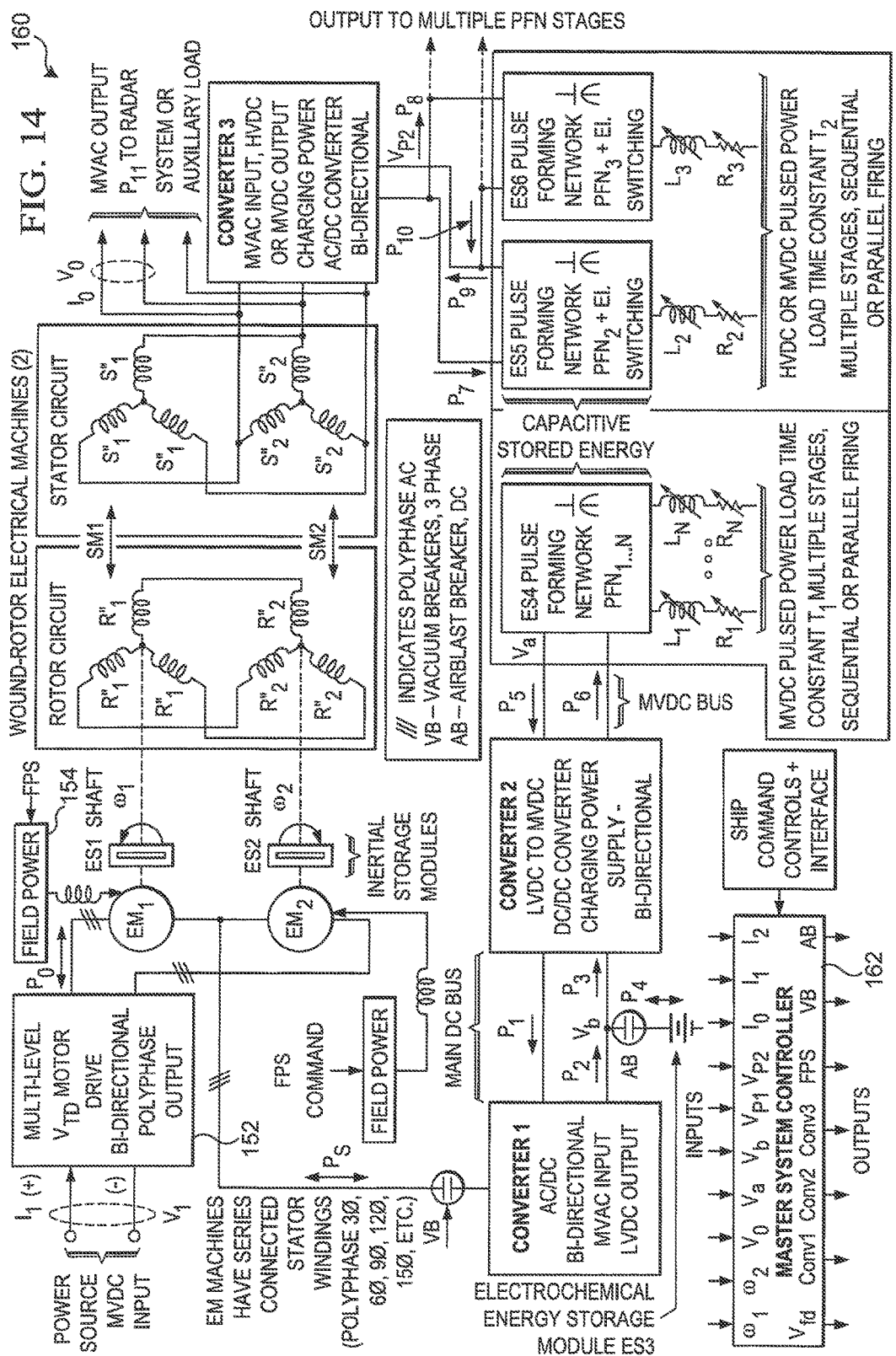
FIG. 14 illustrates a system having dual synchronous modulators with balanced and synchronized output electrical machines including the feature of wound-rotor synchronous motor input showing the output for a radar AC supply and two distinct & different pulsed power loads with different time constants and response times.
Figure 15:
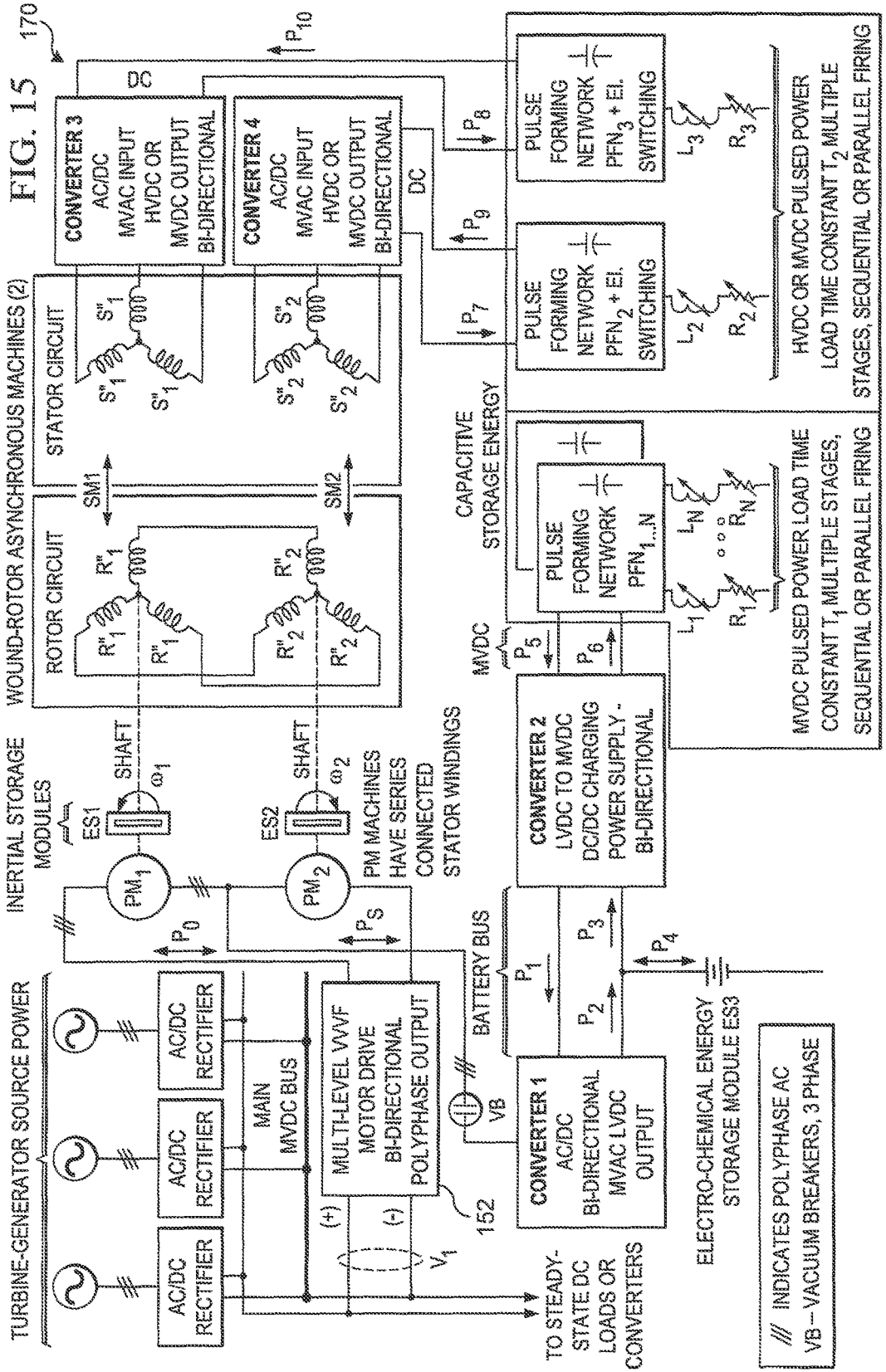
FIG. 15 illustrates a system including dual synchronous modulators with two different types of pulsed power loads and rotating machinery dual stators driving independent HVDC or MVDC pulse forming networks as loads.

FIGS. 13, 14 and 15 show a means and apparatus for utilizing a dual synchronous modulator fully regenerative system to feed and control pulsed power loads with two or more significantly different time constants and five (5) principal sources of stored energy as follows:

Two inertial storage modules (ES1, ES2) controlled by the input drive motors PM1-PM2 or EM1-EM2.

One electrochemical storage module ES3 on the main low voltage (LVDC) DC bus.

One energy storage capacitive module ES4 integral to the Pulse Forming Network 1.

One energy storage capacitive module ES5 integral to the Pulse Forming Network 2.

FIG. 13 illustrates a dual synchronous modulator system 150 with balanced wound-rotor output electrical machines with two principal pulsed power outputs of different time constants and 5 energy storage units. An objective of this configuration is to minimize power and current fluctuations on the incoming MVDC power source or MVAC input despite large and frequent energy pulses being delivered to multiple loads. A multi-level variable voltage variable frequency (VVVF) motor drive 152 feeds two main drive motors PM1 and PM2 arranged in series stator connection to yield equal stator currents and have balanced torque. Permanent magnet motor PM1 is connected to ES1 inertial/flywheel unit and on the same shaft as the wound 3-phase rotor from the synchronous modulator SM1. The stator from the SM1 is at a frequency independent of the main motor drive frequency but linearly related to the shaft speed. It is an important aspect of this disclosure that the rotor circuit of SM1 is directly connected to the rotor circuit of synchronous modulator SM2. The rotor of SM2 is directly coupled to the ES2 inertial storage unit and to the permanent magnet motor PM2. The shaft of SM1 is arranged to turn counterclockwise to the rotation of the shaft for SM2, and in so doing this results in minimal net torsional torque on the baseplate and overall system since machines SM1 and SM2 are to be co-located. The stator output of SM2 is parallel connected to the SM1 output to yield polyphase AC to two loads:

a. Polyphase MVAC output to serve quasi-pulse loads such as radar.

b. A bi-directional AC-to-DC rectifier or AC-DC converter (No. 3) which ultimately supplies power to a series of pulse forming networks (PFN 2, PFN3, . . . PFNn), which are sequentially or parallel fired to create a high current high voltage output waveform with basic time constant of load "T2".

This particular arrangement can transmit to or absorb power from the PFN2 to the stator circuits of the synchronous modulator, and in turn, send real power back to the inertial storage sets ES1 and ES2 in a balanced fashion. There is an operational and stability advantage to having the stators connected in parallel and the two input drive motors connected in series.

Power (P2) to charge the electrochemical storage unit ES3 is obtained by accessing (at a midpoint connection) the variable frequency power Ps supplied to the two PM drive motors. AC/DC Converter No. 1 is a MVAC input to LVDC output converter that is bidirectional. Normally, power P3 is taken from the ES3 and sent to the Converter 2 which changes LVDC to MVDC for powering of the second group of PFN modules PFN1. Power P6 is a charging power to the PFN1 and power P5 is a regenerative power to be taken from the PFN system in the event of a system abort operations whereby the PFN must be quickly unloaded, or discharged.

In some cases, the power delivered to the Converter 2 must be very high for high rep-rate; as such, power from the Converter 1 at P2 is added to the power available from the electro-chemical source P4 to yield a combined power P3. In the event of a line power failure or total disconnect on the MVDC input, and a desire to quickly unload the PFN storage without damaging the electro-chemical module (from a high recharge rate), this configuration allows for the PFN1 and Converter 2 to directly feed power P1 to the Converter 1 and permanent magnet machines PM1, PM2 without sending any significant power or energy to the electrochemical storage module ES3. If ES1 and ES2 are relatively low in inertial stored energy, then excess PFN energy can be returned to ES1 & ES2 to increase flywheel speed, otherwise, the PFN energy must be transferred back to the MVDC line.

System 150 also allows for the quick and efficient transfer of energy from PFN1 to PFN2 via the path without involving the input line or input motor drive:
  a. Power P5 to P1 to Ps thru PM1-PM2, ES1-ES2 to wound rotors R1, R2 of SM1-SM2 then to stators of SM1-SM2 and hence to Converter 3 to output power P7 and hence to PFN2.
  b. This arrangement allows the system to add or subtract a fixed and controllable amount of energy from PFN1 depending on the speed and energy level of ES1 and ES2.

In a preferred embodiment, Converter 3 charges a series of multiple PFNs (e.g., PFN2, PFN3, etc.) simultaneously, but discharges this same group of PFNs sequentially with microsecond to millisecond triggering delays between PFN modules so as to create and shape the final output pulse according to a predetermined wave-shape, such as square wave of current. Converter 3 has an inherently higher DC voltage output than Converter 2 and each converter is feeding a PFN with two or more different characteristic impedances and different load time constants. In each load, it is assumed the resistive and inductive components are both time varying dynamic loads and require, in a preferred embodiment, a PFN circuit that can deliver a constant current over the pulse period. At all times the system can support the radar or auxiliary AC polyphase load P11 at the output of the combined synchronous modulator outputs without causing heavy current, energy or power fluctuations on the MVDC input line or similar source, even if an AC line. The arrangement also allows for a pulsing radar load to be connected to converter 2 instead of the PFN1, whereby the radar may have a MVDC or LVDC main power input as P6.

FIG. 14 illustrates a system 160 having dual synchronous modulators with balanced and synchronized output electrical machines including the feature of wound-rotor synchronous motor input showing the output for a radar AC supply and two distinct & different pulsed power loads with different time constants and response times. System 160 is similar to system 150 of FIG. 13 except that the input PM drive motors have been replaced with wound-field synchronous motors requiring separate field excitation power supplies (FPS) 154 which provide an extra level of input and output power control on the system. The system 160 also allows for fast shut down of the system in the event of a short circuit at the output of, or internal to, the multi-level VFD motor drive. The individual field control command to FPS 154 allows the operator to finely adjust the two counter-rotating flywheel systems to be exactly at the same speed and same energy level, accounting for internal losses in all of the electrical machines and slight differences in efficiency between SM1 and SM2.

FIG. 14 shows basic input and output parameters for the master controller 162 as follows:
Input measured quantities to Controller 162:
  1. Omega 1 shaft speed ($W_1$)
  2. Omega 2 shaft speed ($W_2$)
  3. MVDC Input source voltage V1
  4. Converter 2 Output Voltage Va
  5. Main DC bus or battery Voltage Vb
  6. Main AC output Voltage on synchronous modulator stators Vo
  7. HVDC bus voltage on Converter 3 output Vp2
  8. Operator Command or Ship Master Control requesting specific energy level
  9. AC Output Current Io of synchronous modulators
  10. AC Input Line Current I1 to multi-level motor drive
  11. AC Input Current to EM1-EM2 Drive Motors 12
Output Commands from Controller 162:
  1. Variable Frequency drive, frequency and voltage command signal Vfd
  2. Converter 1 gating command CONV1 for ramp rate and output current/voltage
  3. Converter 2 gating command CONV2 for ramp rate and output current/voltage to PFN1 or load energy ES4
  4. Converter 3 gating command CONV3 for ramp rate and output current/voltage to PFN2, PFN3
  5. Field Power Supply Command signal FPS for field current and ramp rate of excitation
  6. Vacuum Breaker Command Signal VB for power input to Converter 1
  7. Airblast Breaker Command Signal AB to circuit feeding electro-chemical storage module ES3

The preferred embodiment for the master controller 162 is an FPGA controller with ability to use adaptive control techniques and vector control of the electrical machinery.

FIG. 15 illustrates a system 170 including dual synchronous modulators with two different types of pulsed power loads and rotating machinery dual stators driving independent HVDC or MVDC pulse forming networks as loads. System 170 differs from the previous layouts of FIG. 13 and FIG. 14 in that it separates the synchronous modulator outputs into two identical power paths feeding two identical AC-to-DC converters which are boost converters, and in the preferred embodiment, produce high voltage DC (HVDC) power P7 and P8 going to two or more PFN master modules PFN2 and PFN3. PFN2 and PFN3 may be further subdivided into smaller PFN sub-modules which are sequentially or parallel fired. The sequential firing produces the output waveforms of most interest. In this arrangement, PFN2 may be fired first followed by PFN3 firing, then alternating back and forth between these PFN groups to balance the overall energy transfer from storage system of ES1 and ES2 with minimal power being drawn from the MVDC input power source. Reverse power flow directions for P9 and P10, the electrical machinery and AC/DC Converters 1&2, as well as incoming power Po, indicate the system is fully bidirectional, and can recover unused PFN energy and return this to inertial storage ES1 and ES2.

Electrical balance between the two system halves SM1 and SM2 is maintained due to the rotor circuits being directly connected which share a common electrical frequency despite slight differences in shaft speeds. The preferred embodiment for the AC/DC converters 1, 3 & 4 are thyristor or IGBT controlled dual bridge rectifiers with means for regenerative energy flow. Converter 2 is of the DC-DC type shown in FIG. 6 whereby a step-up in DC level is provided by a set of step-up medium frequency transformers followed by full wave rectification. Converters 3 and 4 have the ability to provide HVDC output at voltages e.g. of 5 kV to 100 kV with existing state of the art thyristor stacks. Alternate embodiments include IGBT switching devices and a multi-level output winding for both SM1 and SM2, whereby the output power converters are arranged in series-aiding and fed from a 6-phase, 9-phase, 12-phase or 15-phase stator winding arranged in separate groups of 2, 3, 4, or 5 sets of isolated 3-phase windings. The apparatus of FIG. 15 provides a means of powering PFN1 of principal time constant T1 simultaneously with powering PFN2 or PFN3 of principal time constant T2 and at a higher voltage or power level.

It should be evident to one skilled in the art that multiple combinations of the arrangements described in FIGS. 13, 14 and 15 constitute a practical system whereby very high energy storage is required. The timing chart of FIG. 12 does not apply to FIGS. 13, 14, 15 since these systems are essentially synchronous; however, when used in multiplicity then an arrangement of four (4) synchronous modulators and four (4) flywheels can allow the sequential energy transfer as shown in FIG. 12.

Figure 16:
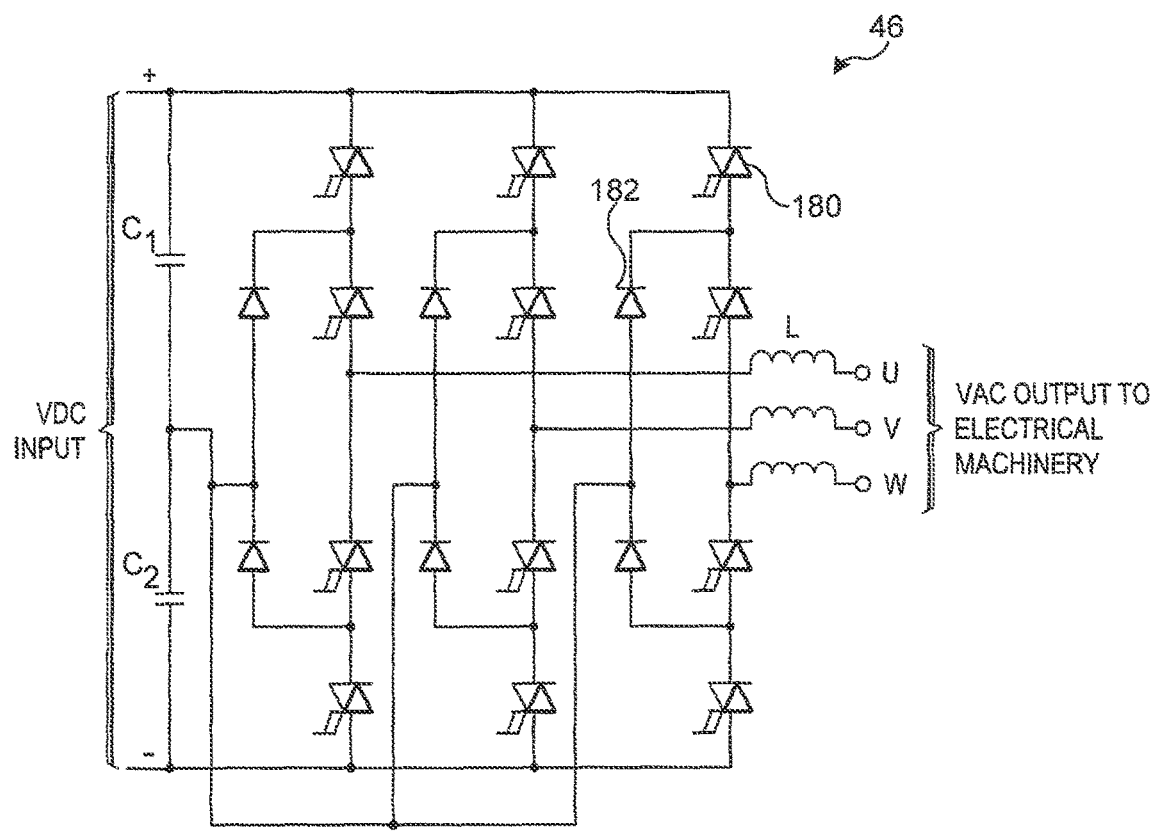
FIG. 16 illustrates one embodiment of an input power DC-AC converter stage.

FIG. 16 illustrates one embodiment of input power DC-AC converter stage 46. The 3-level voltage source inverter is used for producing the variable-voltage variable-frequency (VVVF) 3-phase AC power from a MVDC input source to power the primary windings on a multi-phase synchronous modulator. The specific circuit shown uses twelve reverse conducting integrated gate commutated thyristors (IGCTs) 180 and 6 power diodes 182 in a Voltage Source Inverter (VSI). Capacitors $C_1$ and $C_2$ form a midpoint voltage necessary for a 3-level output. Pulse width modulation control is a preferred method to regulate output voltage and current. The 3-level inverter produces a higher quality AC output with less distortion than a 2-level converter and is advantageous. This circuit is applicable to FIGS. 4, 5, 8A-8B, 9A-9B, 11A-11B, 13, 14 and 15 discussed above. The circuit also functions as a low or medium voltage DC-to-AC converter (Converter No. 1) in FIGS. 13, 14 and 15 for directing DC battery power to the mid-point of the synchronous modulator AC input through the path P5 for charging of the flywheel energy storage or relieving the battery of excess chemical stored energy.

Multiple VSI units (e.g., 3 units) may be used to power a 9-phase input system to the synchronous modulator. In a 15-phase system, 5 VSI are used. Current IGCT devices are manufactured at voltage levels exceeding 8.0 kV and thus application to 15 kV class systems only requires 3 devices in series per leg. This type of inverter may be used in parallel or series combinations to achieve MVDC-to-AC conversion. It should be understood that, for example, a polyphase synchronous modulator may have, e.g., five (5) electrically independent stator input windings totaling a 15-phase system, and thus require 5 VSI modules, thereby increasing redundancy. In the event of a failure of one VSI module, the system would be able to operate at 80% power level which is advantageous. FIG. 16 is a preferred embodiment when the output frequency is moderate such as 2-5 kHz, the voltage levels are medium voltage and fast response is necessary for changing frequency. This is a lightweight configuration since no transformers are involved in this converter.

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke 35 U.S.C. Section 112(f) as it exists on the date of filing hereof unless the words "means for" or "step for" are explicitly used in the particular claim.

What is claimed is:

1. A system, comprising:
an inertial energy storage device;
a first dynamo-electric machine directly coupled to the inertial energy storage device, the first dynamo-electric machine having (i) multiple input stator windings configured to accept input power and (ii) at least one output stator winding configured to deliver electric power to a direct current (DC) bus;
a secondary energy storage system coupled to the DC bus and configured to exchange electrical energy in a bidirectional manner;
a second dynamo-electric machine coupled to the inertial energy storage device and the first dynamo-electric machine, the second dynamo-electric machine having (i) an input stator winding and (ii) at least one output stator winding coupled to an alternating current/direct current (AC/DC) power converter, the power converter coupled to a DC output configured to couple to a load devices; and
an exciter configured to derive energy from the DC bus and excite the input stator winding of the second dynamo-electric machine.

2. The system as specified in claim 1, wherein the at least one output stator winding of the first dynamo-electric machine is configured to deliver the electric power to the DC bus at a plurality of power, duty-cycle, and voltage levels.

3. The system as specified in claim 1, wherein the system s configured to hi-directionally transfer energy between the DC output, the secondary energy storage system, the inertial energy storage device, and an alternating current (AC) source associated with the input power.

4. The system as specified in claim 1, further comprising a pulse forming network (PFN) coupled between the DC bus and the exciter, the PFN configured to provide fast excitation control of the second dynamo-electric machine.

5. The system as specified in claim 4, wherein the second dynamo-electric machine has a plurality of electrically isolated stator outputs formed by a plurality of output stator windings configured to create discrete electrical phase shifts between the plurality of output stator windings.

6. The system as specified in claim 5, wherein the second dynamo-electric machine has four electrically isolated 3-phase stator outputs configured to provide discrete phase shifts of 0 degrees, 15 degrees, 30 degrees, and 45 degrees.

7. The system as specified in claim 5, further comprising the power converter, the power converter coupled between the at least one output stator winding of the second dynamo-electric machine and the DC output, the power converter configured to increase frequency and voltage and to perform rectification and inversion functions.

8. The system as specified in claim 7, wherein the power converter comprises a bi-directional rectifier and inverter configured to permit power flow into and out of the second dynamo-electric machine and energy recovery to the inertial energy storage device.

9. The system as specified in claim 1, further comprising a bi-directional rectifier and inverter coupled between the at least one output stator winding of the first dynamo-electric machine and the DC bus.

10. The system as specified in claim 1, further comprising a pulse forming network (PFN) driven load coupled to the DC bus.

11. The system as specified in claim 10, further comprising a stochastic load coupled to the DC bus and configured to draw energy from either the secondary energy storage system or the inertial energy storage device.

12. The system as specified in claim 1, further comprising an array of active front end (AFE) and load resonant converters (LRCs) coupled to the input stator windings of the first dynamo-electric machine and configured to receive energy from a power source.

13. The system as specified in claim 12, wherein the AFE and LRCs are configured to provide variable-voltage variable-frequency power from a DC power source.

14. The system as specified in claim 1, further comprising a gearbox configured to increase a speed of a shaft at the second dynamo-electric machine and the inertial energy storage device.

15. The system as specified in claim 1, wherein the first dynamo-electric machine and the second dynamo-electric machine each comprise a wound-rotor field doubly-fed induction machine.

16. The system as specified in claim 1, wherein the secondary energy storage system comprises an electro-chemical battery.

17. A system, comprising:
a flywheel;
a first dynamo-electric machine directly coupled to the flywheel, the first dynamo-electric machine having (i) multiple input stator windings configured to accept power and ii at least one output stator winding configured to deliver electric power to a direct current (DC) bus;
an electro-chemical battery coupled to the DC bus and configured to exchange electrical energy in a bidirectional manner;
a second dynamo-electric machine coupled to the flywheel and the first dynamo-electric machine, the second dynamo-electric machine having (i) an input stator winding and (ii) a plurality of output stator windings each coupled to a DC output; and
an exciter configured to derive energy from the DC bus and excite the input stator winding of the second dynamo-electric machine;
wherein the system is configured to bi-directionally transfer energy between the DC output, the electro-chemical battery, and the flywheel.

18. The system as specified in claim 17, wherein the output stator windings of the second dynamo-electric machine are configured to create discrete phase shifts, the output stator windings of the second dynamo-electric machine forming multiple groups of polyphase windings that are galvanically isolated from each other.

19. The system as specified in claim 18, further comprising an array of step-up transformers and power converters configured to drive a pulse forming network or a pulsed load.

20. The system as specified in claim 18, wherein the first dynamo-electric machine is operable in a dual mode, the dual mode comprising (i) a first mode where the first dynamo-electric machine is operating synchronously and (ii) a second mode where the first dynamo-electric machine is operating in a variable-speed mode during discharge and recharge of flywheel energy.

* * * * *